US008418100B2

(12) United States Patent
Wang et al.

(10) Patent No.: US 8,418,100 B2
(45) Date of Patent: *Apr. 9, 2013

(54) ROBUST SCAN SYNTHESIS FOR PROTECTING SOFT ERRORS

(75) Inventors: Laung-Terng Wang, Sunnyvale, CA (US); Nur A. Touba, Austin, TX (US); Shianling Wu, Princeton Junction, NJ (US); Ravi Apte, San Jose, CA (US)

(73) Assignee: STARDFX Technologies, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/416,529

(22) Filed: Mar. 9, 2012

(65) Prior Publication Data
US 2012/0173940 A1   Jul. 5, 2012

Related U.S. Application Data

(63) Continuation of application No. 12/508,977, filed on Jul. 24, 2009, now Pat. No. 8,161,441.

(51) Int. Cl.
*G06F 17/50* (2006.01)
(52) U.S. Cl.
USPC .......................................... 716/106; 716/107
(58) Field of Classification Search ........... 716/106–109
See application file for complete search history.

(56) References Cited

U.S. PATENT DOCUMENTS

| 6,957,403 | B2 * | 10/2005 | Wang et al. ............. 716/103 |
| 7,188,284 | B2 | 3/2007 | Mitra et al. |
| 7,278,074 | B2 | 10/2007 | Mitra et al. ............. 714/724 |
| 7,278,076 | B2 | 10/2007 | Zhang et al. ............. 714/726 |
| 7,331,032 | B2 * | 2/2008 | Wang et al. ............. 716/103 |
| 7,373,572 | B2 | 5/2008 | Mak et al. ............. 714/729 |
| 7,482,831 | B2 | 1/2009 | Chakraborty et al. |
| 7,523,371 | B2 | 4/2009 | Mitra et al. |
| 8,161,441 | B2 * | 4/2012 | Wang et al. ............. 716/108 |

OTHER PUBLICATIONS

R Kuppuswamy, P. DesRosier, D. Feltham, R Sheikh, and P. Thadikara, "Full Hold-Scan Systems in Microprocessors: Cost/Benefit Analysis," *Intel Technology Journal*, vol. 8, Issue 1, Feb. 2004.
A. Carbine and D. Feltham, "Pentium Pro Processor Design for Test and Debug," *IEEE Design and Test of Computers*, vol. 15, No. 3, pp. 77-82, Jul.-Sep. 1998.
M. Zhang, S. Mitra, T.M. Mak, N. Seifert, N.J. Wang, Q. Shi, K.S. Kim, N.R. Shanbhang, and S.J. Patel, "Sequential Element Design with Built-In Soft Error Resilience," *IEEE Transactions on Very Large Scale Integration Systems*, vol. 14, No. 12, pp. 1368-1378, Dec. 2006.

(Continued)

*Primary Examiner* — Binh Tat
(74) *Attorney, Agent, or Firm* — Bacon & Thomas, PLLC

(57) ABSTRACT

A method for performing robust scan synthesis for soft-error protection on a design for generating a robust scan design in a system is modeled selectively at a register-transfer level (RTL) or a gate level; the design includes at least a sequential element or a scan cell for mapping to a robust scan cell of a select robust scan cell type. The method comprises performing a scan replacement and a scan stitching on the design database based on a given control information file for synthesizing the robust scan cell on the design database; and generating the synthesized robust scan design at a pre-determined RTL or a pre-determined gate level.

16 Claims, 33 Drawing Sheets

OTHER PUBLICATIONS

A. J. Drake, A. KleinOsowski, and A.K. Martin, "Self-Correcting Soft Error Tolerant Flop-Flop," *Proc. NASA Symposium on VLSI Design*, 2005.

M. Nicolaidis, "Time Redundancy Based Soft-Error Tolerance to Rescue Nanometer Technologies," *Proc. VLSI Test Symposium*, pp. 86-94, Apr. 1999.

P. Elakkumanan, K. Prasad, and R. Sridhar, "Time Redundancy Based Scan Flip-Flop Reuse to Reduce SER of Combinational Logic," *Proc. International Symposium on Quality Bectronic Design*, pp. 919-624, 2006.

R. Oliveira, A. Jagirdar, and T.J. Chakraborty, "A TMR Scheme for SEU Mitigation in Scan Flip-Flops," *Proc. International Symposium on Quality Electronic Deisgn*, pp. 905-910, 2007.

B. I. Dervisoglu and G.E Strong, "Design for Testability: Using Scan Path Techniques for Path-Delay Test and Measurement," *Proc. International Test Conf.*, pp. 365-374, 1991.

S. Almukhaizim, F. Shi, and Y. Makris, "Coping with Soft Errors in Asynchronous Burst-Mode Machines," *Proc. IEEE International Symposium on Asynchronous Circuits and Systems*, pp. 151-160, 2008.

\* cited by examiner

S-element Truth Table 1800

| Mode | SEL_A | SEL_B | SEL_C | TEST | Description |
|---|---|---|---|---|---|
| Normal | 0 | 0 | 0 | 0 | Majority vote for soft-error correction |
| Select AB | 1 | 1 | 0 | 1 | Select C-element *AB* |
| Select BC | 0 | 1 | 1 | 1 | Select C-element *BC* |
| Select AC | 1 | 0 | 1 | 1 | Select C-element *AC* |
| Select A | 1 | 0 | 0 | 1 | Select *A* only |
| Select B | 0 | 1 | 0 | 1 | Select *B* only |
| Select C | 0 | 0 | 1 | 1 | Select *C* only |

ROBUST SCAN SYNTHESIS FOR PROTECTING SOFT ERRORS

This application is a continuation of U.S. patent application Ser. No. 12/508,977, filed Jul. 24, 2009.

FIELD OF THE INVENTION

The present invention generally relates to the field of scan-based design and test using design-for-test (DFT) techniques. Specifically, the present invention relates to soft-error detection and correction.

BACKGROUND

Soft errors are transient faults caused by various types of radiation. Radiation-induced transient faults can abruptly flip the stored state of a system and cause a system crash or even worse—a silent data corruption (SDC)—if they are undetected.

Atmospheric radiation, such as cosmic rays, have long been regarded as the major source of soft errors, especially in memories, and chips used in space applications typically use parity or error-correcting code (ECC) for soft-error protection. As process geometries continue to scale down, the amount of energy required to cause an error is lowered. Reduced feature sizes, higher logic densities, shrinking node capacitances, lower supply voltage, and shorter pipeline depth have significantly increased the susceptibility of integrated circuits (ICs) to single event upsets (SEUs) in memories and sequential elements (including scan cells), and single event transients (SETs) in combinational logic. Terrestrial radiation, such as alpha particles from the packaging materials of the chip, is also starting to cause soft errors with increasing frequency. This has also created system reliability concerns, especially for chips used in the automotive, healthcare, and networking industries.

Recent studies reveal that for an IC designed with a feature size smaller than 65 nm, all memories, combinational logic, and sequential elements are more susceptible to soft errors. Since parity or ECC circuits are often used to protect memories from soft errors, the remaining issues are how to identify and harden or protect those scan cells and combinational logic that are most susceptible to soft errors.

Prior art approaches have centered on designing new robust scan cells using a basic scan flip-flop [1] or a scanout flip-flop [2] as a basic scan cell. The basic scan flip-flop consists of a system flip-flop and a scan portion for test purpose. The scanout flip-flop consists of a system flip-flop and a scanout portion for debug purpose. Alternatively, the system flip-flop can be a latch or a pulse latch [3]. The data input signal and the system clock controlling the system flip-flop are reconfigured to drive the scan portion and the scanout portion. For instance, researchers at Intel have designed a few robust scan cells using the built-in soft error resilience (BISER) technique for protecting these basic scan cells from SEUs (see U.S. Pat. Nos. 7,278,074; 7,188,284; 7,278,076; and 7,373,572 issued to Mitra, Zhang, Mak, et al.) and further using time redundancy for protecting combinational logic from SETs (U.S. Pat. No. 7,523,371 issued to Mitra et al.). A typical BISER cell may consist of a basic scan flip-flop and an output joining circuit for both test and soft-error resilience. Alternatively, the typical BISER cell may consist of a scanout flip-flop and an output joining circuit for both debug and soft-error resilience. The output joining circuit may be a transmission gate, a C-element, an XOR gate, or an error detection circuit (see FIGS. 1-5). Other research has time redundancy, triple modular redundancy (TMR) including a majority voter (see FIG. 6), or a combination of both for soft-error correction [4, 5, 6, 7]. For instance, a U.S. Pat. No. 7,482,831 issued to Chakraborty et al. (January 2009) uses a special type of TMR and a majority voter for correcting soft errors caused by SEUs in the scan cells. The TMR comprises a system flip-flop, a scan portion, and a hold flip-flop; the hold flip-flop takes an input from an output of the system flip-flop and is also used for enhanced scan testing which eases test generation and test application for delay faults [8]. These prior art approaches, however, do not address the need for robust scan cells with the capabilities for performing (1) a functional testing using slow-speed snapshot which allows the system to shift out the contents of the robust scan cells, upon capturing the data input signal, at a reduced shift clock frequency when the system clock is still running, (2) a functional testing using at-speed or slow-speed signature analysis which allows the system to generate the XOR value (called a signature) of the data input signal and the previous scan-in data signal every system clock cycle or every two or more system clock cycles, (3) a defect tolerance which allows the system to continue operation when the system flip-flop in the robust scan cell has permanent defects, and (4) a manufacturing test which allows designers to capture the output from the system flip-flop for analysis. Also, there are no effective robust scan designs available that can tolerate both SEUs in the latches and SETs in combinational logic, while at the same time being able to perform test, debug and defect tolerance. There are also no effective defect-tolerance schemes to protect redundant modules (e.g., when using duplication or TMR) against permanent defects, while protecting synchronous or asynchronous designs against soft errors [9].

Therefore, there is a need to develop more robust scan cells for test, debug, soft-error protection (either soft-error resilience or soft-error correction), and defect tolerance. There is also a need to develop a robust scan synthesis flow that allows designers to synthesize soft-error protection logic, along with needed test, debug, and defect tolerance features, and generate needed testbenches to verify the correctness of the robust scan design. There is also a need to provide a robust defect tolerance scheme to protect redundant modules against permanent defects, while protecting synchronous and asynchronous designs against soft errors.

SUMMARY OF INVENTION

The objectives of the present invention are (1) designing more robust scan cells for test, debug, soft-error protection, and defect tolerance, (2) developing a robust scan synthesis flow that allows designers to synthesize soft-error protection logic, along with needed test, debug, and defect tolerance features, as well as generate needed testbenches to verify the correctness of the robust scan design, and (3) devising a defect-tolerance scheme to protect functionally equivalent modules against permanent defects, while protecting synchronous and asynchronous designs against soft errors.

Throughout the inventions, we assume a system circuit may comprise at least a latch or a system flip-flop; a shadow circuit may comprise at least a latch, a scan portion, or a scanout portion; a debug circuit may comprise at least a latch, a duplicate system flip-flop, a duplicate scan portion, or a scanout portion. Alternatively, each latch may be a pulse latch. To simplify our description, we interchange the system circuit with the system flip-flop, the shadow circuit with the scan portion or the scanout portion, and the debug circuit with the duplicate system flip-flop, the duplicate scan portion, or the scanout portion, wherever appropriate.

Furthermore, a manufacturing test may comprise a test for basic scan testing for structural faults, a test for basic scan testing for delay faults, a test for enhanced scan testing for delay faults, or any combination of the above three tests. A structural fault may include a stuck-at fault, a stuck-open fault, a bridging fault, or an Iddq fault. A delay fault may include a transition faults or a path-delay fault.

In a first embodiment of the present invention, we insert a slow-speed snapshot circuit into two example BISER cells for soft-error resilience (see FIGS. 7-8). The reconfigured BISER cell may include an output joining circuit, comprising selectively at least a transmission gate, a C-element, an XOR gate, or an error detection circuit. Alternatively, the output joining circuit may include a majority voter when soft-error correction is required. The slow-speed snapshot circuit may comprise using a CAPTURE signal to capture data from the system flip-flop to the scan portion (when CAPTURE is equal to 1), and using a scan port to shift out the content of the captured data (when CAPTURE is equal to 0). The scan port may further comprise two non-overlapping scan clocks (SCA and SCB), scan input (SI), and scan output (SO) that form a slow scan chain (SI to SO). In so doing, this slow-speed snapshot circuit will allow designers to shift out the contents of the robust scan cells upon capture, using one or more scan clocks running at a reduced shift clock frequency (called slow-speed) when the system clock is still running The shift-out operation at a reduced shift clock frequency is often referred to as a scan dump.

In a second embodiment of the present invention, we insert a signature analysis circuit into two example BISER cells for soft-error resilience (see FIGS. 9-10). The reconfigured BISER cell may include an output joining circuit, comprising selectively at least a transmission gate, a C-element, an XOR gate, or an error detection circuit. Alternatively, the output joining circuit may include a majority voter when soft-error correction is required. The signature analysis circuit may comprise a signature logic in the scanout portion using a SHIFT signal and a CAPTURE control signals for generating an XOR value (called a signature) of the data input signal and a previous scan-in data signal, SDI. In so doing, this signature analysis circuit will allow designers to sample the contents of the robust scan cells at a reduced clock speed, say every 100 system clock cycles, when the system clock is still running As this feature will allow designers not to shift out the contents of the debug chain (SDI to SDO) at the system clock frequency (at-speed), layout effort will be significant reduced. Alternatively, the designers may also perform a functional testing using at-speed signature analysis for generating the signature of the data input signal and a previous scan-in data signal every system clock cycle, when layout is not an issue.

In a third embodiment of the present invention, we insert a defect tolerance circuit, called an S-element, into two example BISER cells for soft-error resilience (see FIGS. 11-12). The reconfigured BISER cell may include an output joining circuit, comprising selectively at least a transmission gate, a C-element, an XOR gate, or an error detection circuit. Alternatively, the output joining circuit may include a majority voter when soft-error correction is required. The defect-tolerance circuit may comprise using an S-element coupled to a C-element in the output joining circuit to selectively choosing a data output signal O1 of the system flip-flop or a data output signal O2 of the scan portion as a data output signal Q of the S-element. In so doing, this defect-tolerance circuit will allow the system to further continue operation when the system flip-flop in the robust scan cell has permanent defects. This feature will allow designers to reuse the scan portion or the scanout portion for uninterrupted system operation.

In the first, second, and third embodiments of the present invention, the system circuit and shadow circuit each further comprises at least a latch. In the present invention, the system circuit and shadow circuit each further comprises at least a flip-flop. Furthermore, the system circuit can further include a slow scan chain for test purpose and the shadow circuit can further include a debug chain for debug purpose; the output joining circuit may further comprise additional circuitry to perform a slow-speed snapshot operation, a slow-speed signature analysis operation, a defect tolerance operation, an enhanced scan operation, or any combination of the above operations (see FIGS. 13-14).

In a fourth embodiment of the present invention, we insert a TMR circuit into two example BISER cells to correct soft errors caused by SEUs and SETs (see FIG. 15). The reconfigured TMR cell may comprise (1) a system flip-flop, (2) a scan portion, (3) a scanout portion, and (4) a majority voter. Alternatively, the scanout portion in the reconfigured TMR cell may be replaced with a duplicate system flip-flop or a duplicate scan portion. Also, the reconfigured TMR cell must further comprise using an S-element coupled to the majority voter, called a V-element, for defect tolerance. The S-element may include a few transistors which when coupled to the majority voter will pass a selected data output signal to the output terminal of the V-element (see FIGS. 16-17). Alternatively, the S-element may further include a few more transistors that when coupled to the majority voter will further reconfigure the V-element as a C-element to provide the system with an additional graceful degradation capability (see FIG. 18).

In a fifth embodiment of the present invention, we insert a TMR circuit into two example BISER cells to correct soft errors caused by SEUs and SETs (see FIGS. 19-20). The reconfigured TMR cell may comprise (1) a system flip-flop, (2) a scan portion, (3) a scanout portion, and (4) a majority voter. Using a scanout portion as the debug circuit rather than using a hold flip-flop as practiced by Chakraborty et al. (January 2009) in the reconfigured TMR cell, the proposed invention allows adding a separate debug chain for debug purpose in addition to the slow scan chains for manufacturing test. Alternatively, the scanout portion in the reconfigured TMR cell may be replaced with a duplicate system flip-flop or a duplicate scan portion, because enhanced scan testing can be done through the interactions between the scan portion and the system flip-flop. Also, the reconfigured TMR cell may further comprise an S-element coupled to the majority voter, called V-element, for defect tolerance and to selectively provide the system with an additional graceful degradation capability.

In both the fourth and the fifth embodiments of the present invention, the reconfigured TMR cell may further comprise inserting two delay elements each in the data input terminal of the shadow circuit and the debug circuit to correct soft errors caused by SETs in combinational logic (see FIG. 21). Alternatively, the reconfigured TMR cell may further comprise inserting two delay elements each in the clock input terminal of the shadow circuit and the clock input terminal of the debug circuit to correct soft errors caused by SETs in combinational logic (see FIG. 22). The delay time of each delay element is selectively pre-determined or programmable depending on designers' need.

In a sixth embodiment of the present invention, we develop a robust scan synthesis flow for a given design, before or after scan logic/scan synthesis (see FIG. 23). The design may be modeled at a register-transfer level (RTL) or a gate level. Then, the robust scan synthesis flow synthesizes soft-error protection logic, along with needed test, debug, and defect tolerance circuits, into the design, and generate needed testbenches to verify the correctness of the synthesized robust scan design. The robust scan design is generated and modeled at a given RTL or a gate level (see FIG. 24). The synthesis flow may accept a control information file that may comprise a mapping of sequential element types or scan cell types to robust scan cell types, and may selectively include a list of sequential elements and scan cells for the mapping (see FIGS. 25-26). The control information file may further comprise a mapping of combinational cell types to hardened combinational cell types, and may selectively include a list of combinational cells for the mapping. The robust scan synthesis flow may further comprise methods for SER analysis, scan selection, scan replacement (see FIG. 27), scan reordering, scan stitching (see FIG. 28), test generation, and scan verification.

In a seventh embodiment of the present invention, we develop a robust defect-tolerance scheme to tolerate defective modules in an error detection and correction circuit (called an output joining circuit) caused by permanent faults (see FIGS. 29-30). The permanent fault may comprise at least a structural fault or a delay fault. The error detection and correction circuit may comprise two functionally equivalent modules (called redundant modules) when a duplication technique is adopted. The error detection and correction circuit may comprise three functionally equivalent modules when a TMR technique is employed. The structural fault may comprise a stuck-at fault, a stuck-open fault, a bridging fault, or an Iddq fault. The delay fault may comprise a transition fault or a path-delay fault. The design may be a selected one of a synchronous design with clock control, a synchronous scan design with clock control, or an asynchronous design without clock control. The embodiment of the present invention allows the design to continue its system operation, by coupling an S-element to the error detection and correction circuit to swap out up to all-but-one defective redundant module(s).

In an eighth embodiment of the present invention, we insert a manufacturing test circuit and a selectively signature logic into three example BISER cells for soft-error resilience (see FIGS. 31-33). The reconfigured BISER cell may include an output joining circuit, comprising selectively at least a transmission gate, a C-element, an XOR gate, or an error detection circuit. Alternatively, the output joining circuit may include a majority voter when soft-error correction is required. The manufacturing test circuit may include using a LOAD control signal to load the output value of the system flip-flop to the scan portion or the scanout portion. The manufacturing test circuit may further comprise the signature logic in the scanout portion using a SHIFT signal and a LOAD control signals for generating an output value to XOR with the data input signal to form a signature. In so doing, this signature logic will allow designers to sample the contents of the robust scan cells at a reduced clock speed, say every 100 system clock cycles, when the system clock is still running As this feature will allow designers not to shift out the contents of the debug chain (SDI to SDO) at the system clock frequency (at-speed), layout effort will be significant reduced. Alternatively, the designers may also perform a functional testing using at-speed signature analysis for generating the signature of the data input signal and a previous scan-in data signal every system clock cycle, when layout is not an issue.

The foregoing and additional objects, features and advantages of the invention will become more apparent from the following detailed description, which proceeds with reference to the following drawings.

THE BRIEF DESCRIPTION OF DRAWINGS

FIG. 1 is a prior art BISER cell using a transmission gate;
FIG. 2 is a prior art BISER cell using a C-element;
FIG. 3 is a prior art BISER cell using an XOR gate;
FIG. 4 is a prior art BISER cell using an error detection circuit;
FIG. 5 is a prior art BISER cell using two C-elements;
FIG. 6 is a prior art soft-error correction cell using a majority voter;
FIG. 7 is an embodiment of a reconfigured BISER cell for performing a slow-speed snapshot, in accordance with the present invention;
FIG. 8 is another embodiment of a reconfigured BISER cell for performing a slow-speed snapshot, in accordance with the present invention;
FIG. 9 is an embodiment of a reconfigured BISER cell for performing a slow-speed snapshot and slow-speed/at-speed signature analysis, in accordance with the present invention;
FIG. 10 is another embodiment of a reconfigured BISER cell for performing a slow-speed snapshot and a slow-speed/at-speed signature analysis, in accordance with the present invention;
FIG. 11 is an embodiment of a reconfigured BISER cell for performing a defect tolerance using an S-element, in accordance with the present invention;
FIG. 12 is another embodiment of a reconfigured BISER cell for performing a defect tolerance using an S-element, in accordance with the present invention;
FIG. 13 is an embodiment of a reconfigured MUX-based BISER cell to provide slow-speed snapshot, slow-speed/at-speed signature analysis, and defect tolerance capabilities, in accordance with the present invention;
FIG. 14 is another embodiment of a reconfigured MUX-based BISER cell to provide an additional enhanced scan capability for FIG. 13, in accordance with the present invention;
FIG. 15 is a first embodiment of a reconfigured TMR cell for performing a soft-error correction caused by SEUs in sequential elements in the cell, in accordance with the present invention;
FIG. 16 is a first embodiment of an S-element coupled to a majority voter to aid in manufacturing test, in accordance with the present invention;
FIG. 17 is a second embodiment of an S-element coupled to a majority voter to aid in defect tolerance, in accordance with the present invention;
FIG. 18 is a third embodiment of an S-element coupled to a majority voter to aid in defect tolerance as well as graceful degradation, in accordance with the present invention;
FIG. 19 is a second embodiment of a reconfigured TMR cell for performing a soft-error correction caused by SEUs in sequential elements in the cell, in accordance with the present invention;
FIG. 20 is a third embodiment of a reconfigured TMR cell for performing a soft-error correction caused by SEUs in sequential elements in the cell, in accordance with the present invention;
FIG. 21 is a first embodiment of a reconfigured TMR cell for performing a soft-error correction caused by SETs in combinational logic, in accordance with the present invention;
FIG. 22 is a second embodiment of a reconfigured TMR cell for performing a soft-error correction caused by SETs in combinational logic, in accordance with the present invention;
FIG. 23 is a robust scan synthesis flow, in accordance with the present invention;
FIG. 24 is an example D flip-flop based design that is to be synthesized for test, debug, soft-error resilience, and defect tolerance, in accordance with the present invention;

Figure 10:
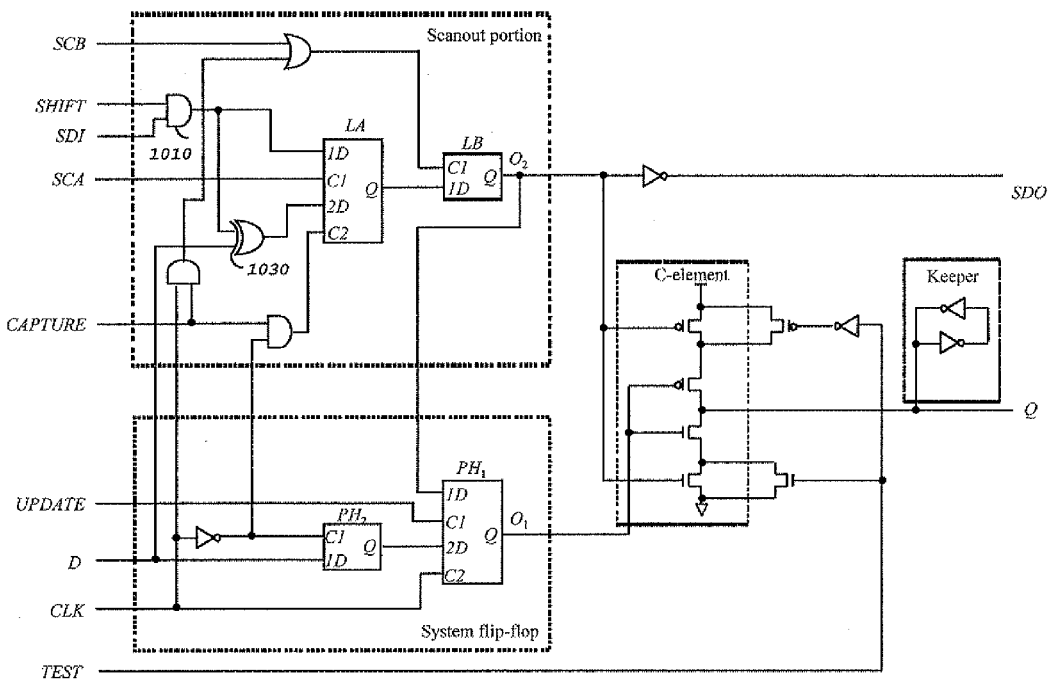
Figure 32:
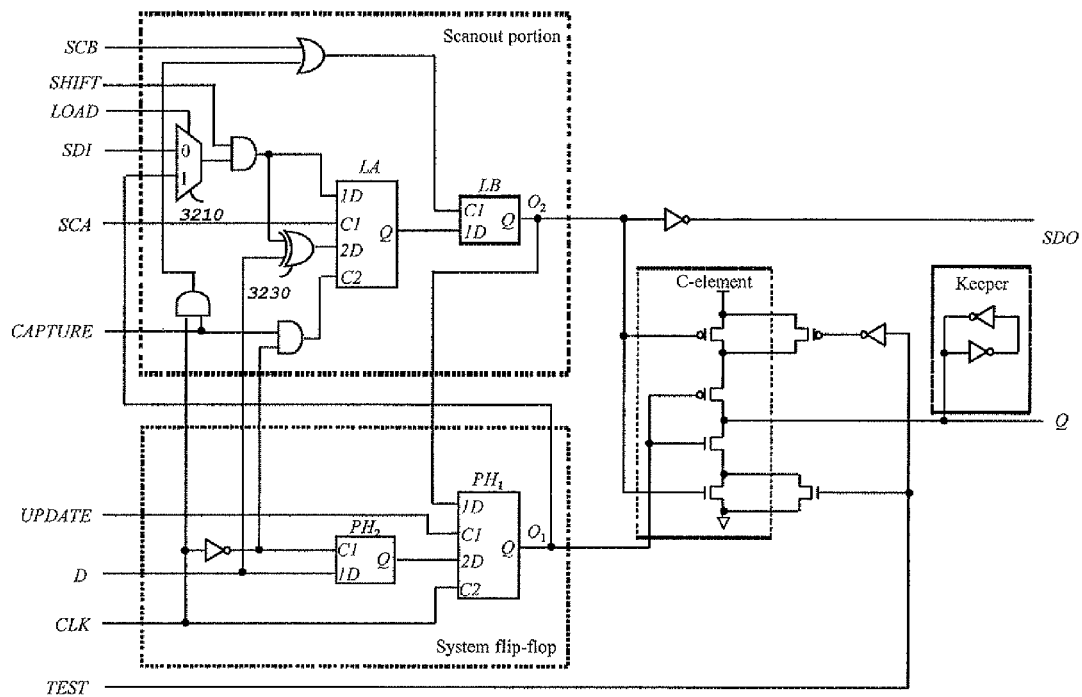
Figure 33:
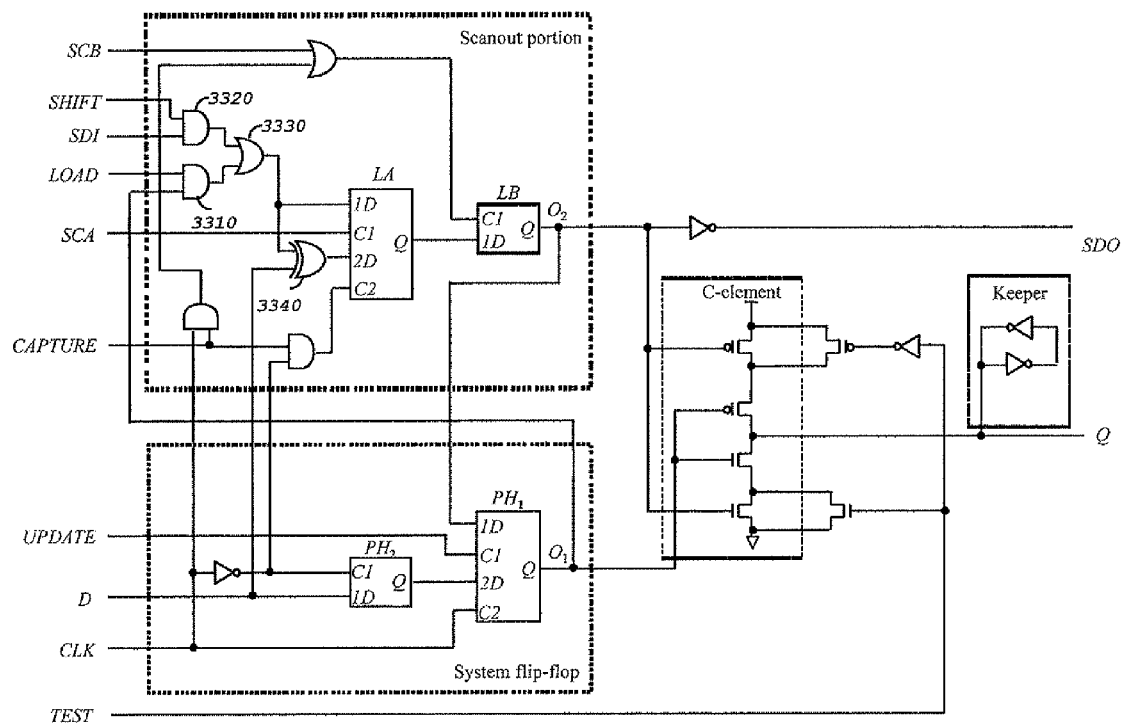

FIG. 32 is an embodiment of a reconfigured BISER cell to provide an additional manufacturing test capability for FIG. 10 that implements slow-speed snapshot and slow-speed/at-speed signature analysis, in accordance with the present invention; and FIG. 33 is another embodiment of a reconfigured BISER cell to provide an additional manufacturing test capability for FIG. 10 that implements slow-speed snapshot and slow-speed/at-speed signature analysis, in accordance with the present invention.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
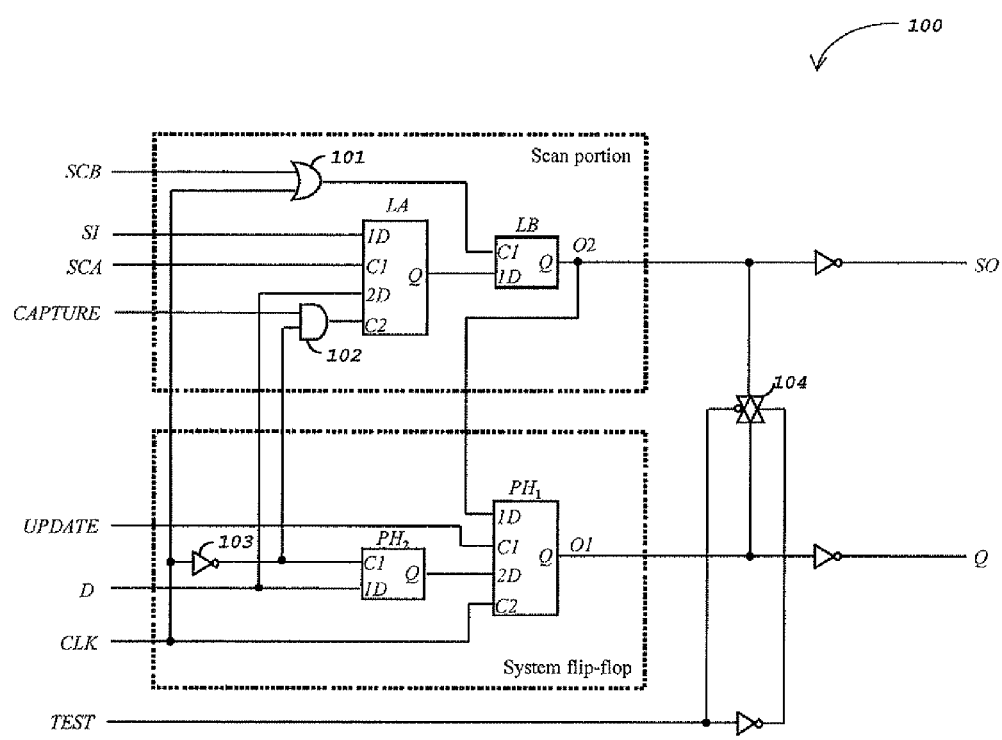

FIGS. 1-6 illustrate the prior art for designing BISER cells. In FIG. 1, a BISER cell is implemented using a transmission gate as the output joining circuit as described by Mitra et al. (U.S. Pat. No. 7,278,074). The cell 100 consists of a system flip-flop and a scan portion, each comprising a one-port D latch (PH2 and LB) and a two-port D latch (PH1 and LA), and a transmission gate 104 which joins the outputs of the system flip-flop, O1, and the scan portion, O2. The data input signal D driving the system flip-flop which connects to the 1D data port of latch PH2 further connects to the 2D data port of latch LA. The system clock CLK present in the system flip-flop which drives latches PH2 and PH1 further drives latches LA and LB in the scan portion through the additions of an OR gate 101, an AND gate 102, and an inverter 103. In so doing, the cell 100 operates in two modes: test mode and system mode. In test mode, TEST is set to 1, and the transmission gate 104 acts as an open circuit and hence does not affect the functional behavior. During the shift operation, a test vector is shifted through input SI into latches LA and LB by alternately applying scan clocks SCA and SCB while keeping CAPTURE and CLK at 0. Then, the UPDATE clock is applied to move the content of LB to PH1. As a result, a test vector is written into the system flip-flop to perform a manufacturing test operation. During the capture operation, CAPTURE is first set to 1, and then the system clock CLK is applied, which captures the circuit response to the test vector (the response is on input D) into the system flip-flop and the scan portion simultaneously. Latches PH2 and LA act as masters and latches PH1 and LB act as slaves, respectively. The circuit response is then shifted out by alternately applying scan clocks SCA and SCB again which shifts the response out through output SO, when the system clock CLK is disabled or set to 0. This means that clocks SCA/SCB and CLK cannot be activated at the same time; hence the circuit performs a capture or snapshot operation for offline test, debug, and diagnosis. In system mode, TEST is set to 0, and the transmission gate 104 couples together the output terminals of latches LB and PH1. This increases the capacitance at the output of these latches thereby reducing the soft error rate (SER). More capacitance makes it harder to disturb the initial state when a particle impacts the latch. Moreover, there are two transistors in the transmission gate 104 trying to hold the initial state and only one of them will be impacted by a particle strike and hence there will always be at least one latch holding the correct data.

Figure 2:
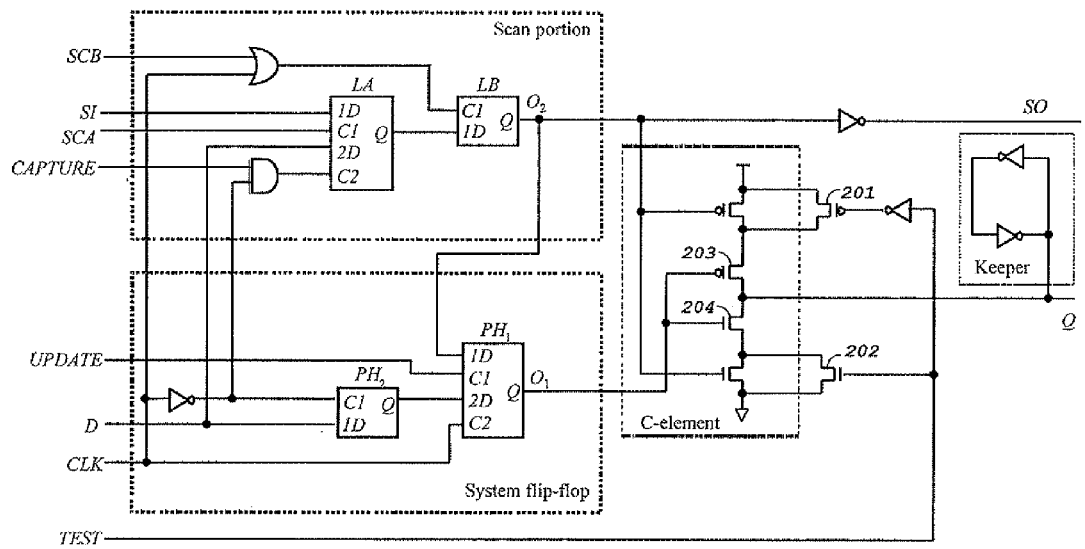

In FIG. 2, a prior art BISER cell is implemented using a C-element as described by Mitra et al. (U.S. Pat. No. 7,278, 074). The cell 200 consists of a system flip-flop and a scan portion, each comprising a one-port D latch (PH2 and LB) and a two-port D latch (PH1 and LA), identical to that in FIG. 1, along with an output joining circuit comprising a C-element and a bus Keeper. The connections between the system flip-flop and the scan portion are the same as in FIG. 1. In test mode, TEST is set to 1, and the C-element acts as an inverter. Transistors 201 and 202 turn on which allows transistors 203 and 204 to invert the output O1 of latch PH1. Otherwise, the behavior during test mode is identical to that of the BISER cell 100 in FIG. 1 which was previously described. In system mode, TEST is set to 0, and the C-element acts as a hold-state comparator. The behavior of the C-element is shown in the truth table in FIG. 2. When O1 and O2 are unequal, the output of the C-element keeps its previous value. As with the BISER cell 100 in FIG. 1, during system mode, 0 is applied to the SCA, SCB, and UPDATE signals, and a 1 is applied to the CAPTURE signal. This converts the scan portion into a master-slave flip-flop that operates as a shadow of the system flip-flop. That is, whenever the system clock CLK is applied, the same logic value is captured into both the system flip-flop and the scan portion. When CLK is 0, the outputs of latches PH1 and LB hold their previous logic values. If a soft error occurs either at PH1 or at LB, O1 and O2 will have different logic values. When CLK is 1, the outputs of latches PH2 and LA hold their previous logic values, and the logic values drive O1 and O2, respectively. If a soft error occurs either at PH2 or at LA, O1 and O2 will have different logic values. In both cases, unless such a soft error occurs after the correct logic value passes through the C-element and reaches the Keeper, the soft error will not propagate to the output Q and the Keeper will retain the correct logic value at Q. Hence, the cell 200 helps mitigate soft errors.

Figure 3:
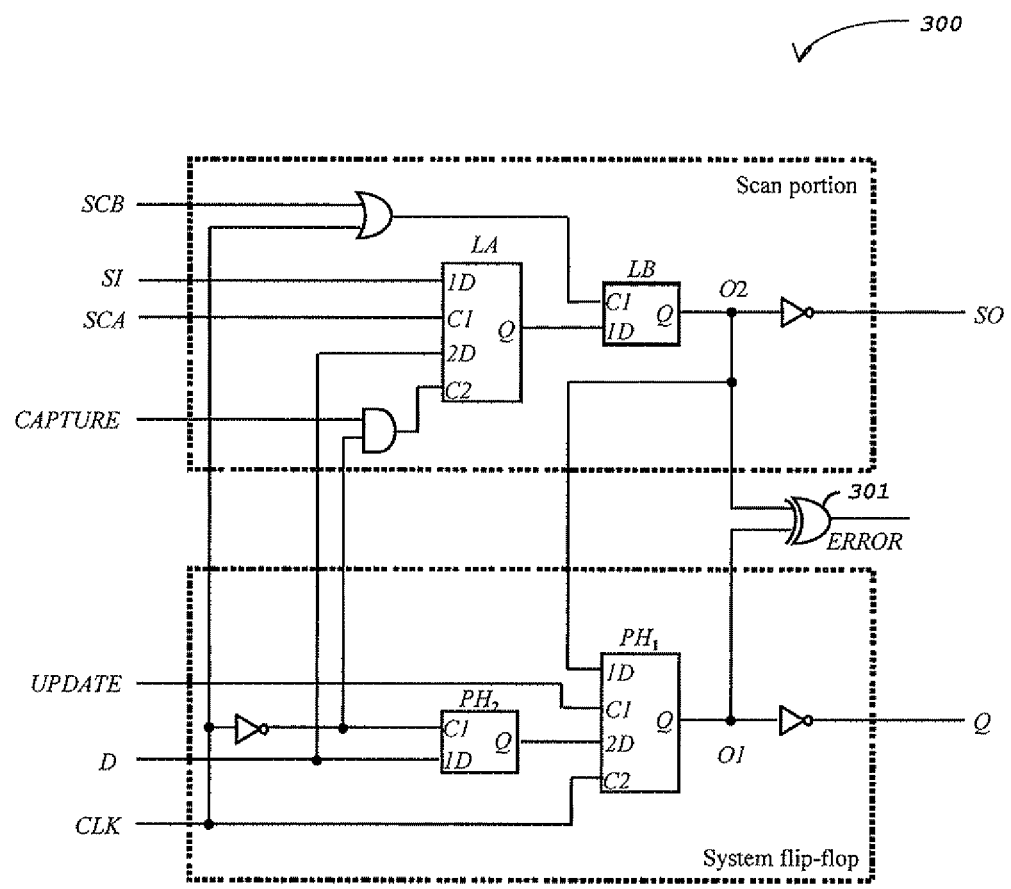

In FIG. 3, a prior art BISER cell is implemented using an XOR gate as the output joining circuit as described by Mitra et al. (U.S. Pat. No. 7,188,284). The cell 300 consists of a system flip-flop and a scan portion, each comprising a one-port D latch (LB and PH2) and a two-port D latch (LA and PH1), identical to that in FIG. 1, along with an exclusive-OR (XOR) gate 301 as the output joining circuit. The behavior during test mode is identical to that of the BISER cell 100 in FIG. 1 which was previously described. No test mode signal is needed, and the output of exclusive-OR gate 301 is ignored during test mode. In system mode, a 0 is applied to the SCA, SCB, and UPDATE signals, and a 1 is applied to the CAPTURE signal. This converts the scan portion into a master-slave flip-flop that operates as a shadow of the system flip-flop. If the logic value captured in the scan portion mismatches with the logic value captured in the system flip-flop, then the XOR gate 301 will generate a 1 on the ERROR output which indicates that an error has occurred. By monitoring the ERROR output when an error occurs, appropriate action can be taken to prevent data corruption in the system and thus mitigate the impact of soft errors.

Figure 4:
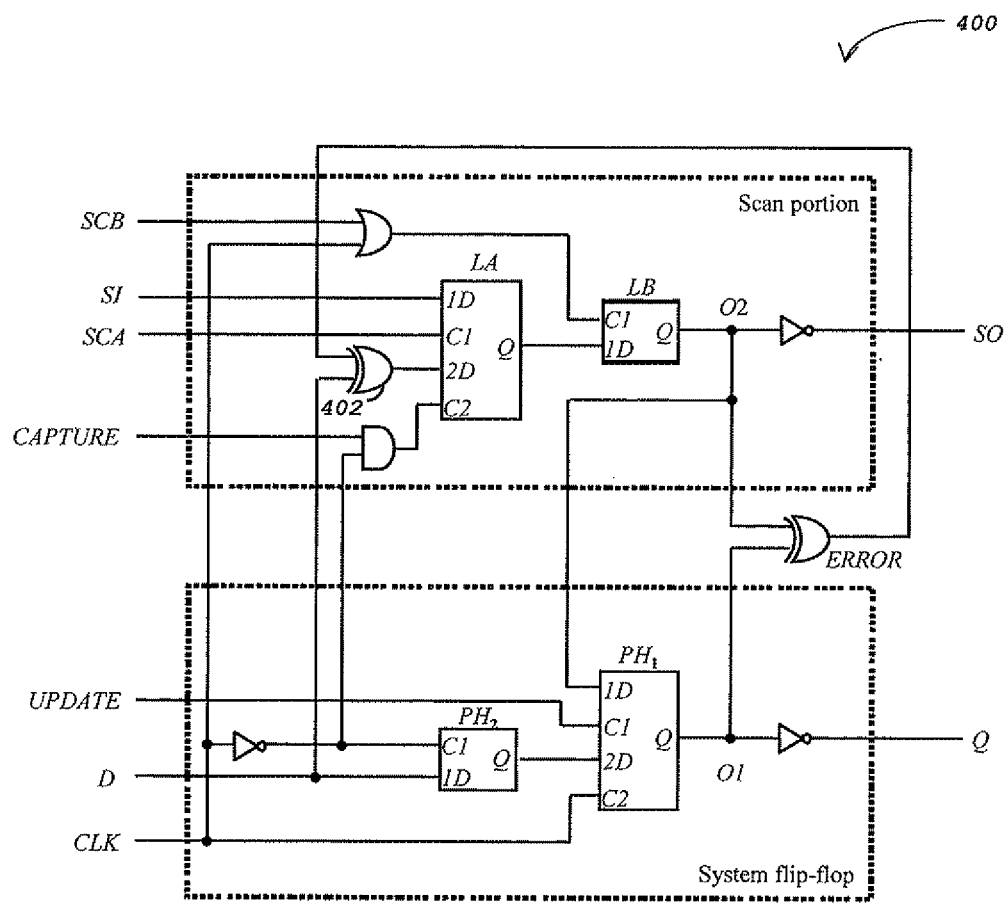

In FIG. 4, a prior art BISER cell is implemented using an XOR gate as the output joining circuit as described by Mitra et al. (U.S. Pat. No. 7,188,284) with an error trapping capability. The cell 400 is identical to the cell 300 in FIG. 3 with the addition of an XOR gate 402 which feeds back the error signal ERROR by XORing it with the data input signal D in the scan portion. The only difference in the behavior of this cell 400 in comparison with the cell 300 in FIG. 3 previously described is that when an error is detected in one clock cycle, the error signal ERROR will become a 1 and thus in the next clock cycle it will invert the value of the data input signal D which is stored in the scan portion. This ensures that in the next clock cycle the data stored in the scan portion will continue to mismatch with the data stored in the system flip-flop and the error signal ERROR will remain a 1. Assuming that the soft error is only present for a single clock cycle (since errors in an even number of clock cycles would cancel out), once an error is detected, it will be "trapped" in the scan portion until it can be scanned out and detected. This avoids the need for monitoring the error signal ERROR in every clock cycle since soft errors get trapped and can be read out later.

Figure 5:
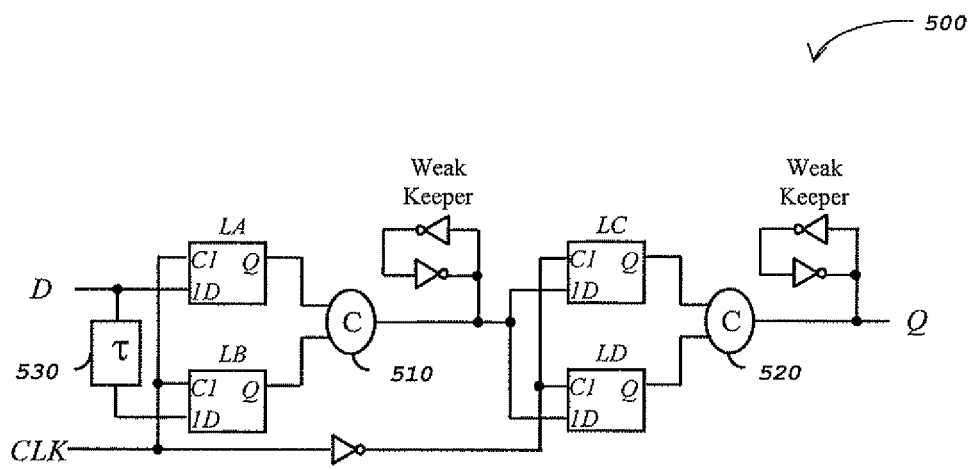

In FIG. 5, a prior art BISER cell 500 is implemented using duplicate master-slave latches with C-elements at the output of each stage and a delayed D input as described by Mitra et al. (U.S. Pat. No. 7,523,371). The first stage of the design consists of a master latch LA along with a duplicate master latch LB that receives its D input after a delay of $\tau$ which is added by delay element 530. A C-element followed by a Weak Keeper is used as an output joining circuit for latches LA and LB, and acts as a hold-state comparator as previously described in FIG. 2. Both latches are clocked by the system clock, CLK. The purpose of delay element 530 is to help mitigate SETs in the combinational logic driving the input D. If an SET occurs in the combinational logic with an upset duration less than $\tau$, then the erroneous upset pulse received by latch LA will have disappeared before the upset pulse going through delay element 530 (which adds a delay of $\tau$) arrives at latch LB. This ensures that no more than one of the inputs to C-element 510 will be in error at any given time in the presence of an erroneous SET pulse of duration less than $\tau$. Hence, the C-element is able to maintain the correct logic value at its output. The output of the C-element 510 drives the slave latch LC along a duplicate slave latch LD. Another C-element 520 followed by a Weak Keeper is used as an output joining circuit for latches LB and LC, and acts as a hold-state comparator as previously described in FIG. 2. Both latches LC and LD are clocked by the complement of the system clock, CLK. The C-element 520 helps to mitigate soft-errors that may impact the latches themselves. If a soft error occurs either at LC or LD, the inputs to C-element 520 will have different logic values. Unless such a soft error occurs after the correct logic value passes through the C-element and reaches the Weak Keeper, the soft error will not propagate to the output Q and the Weak Keeper will retain the correct logic value at Q. Thus, this cell helps to mitigate soft errors in both the combinational logic driving the cell as well as in the cell itself.

Figure 6:
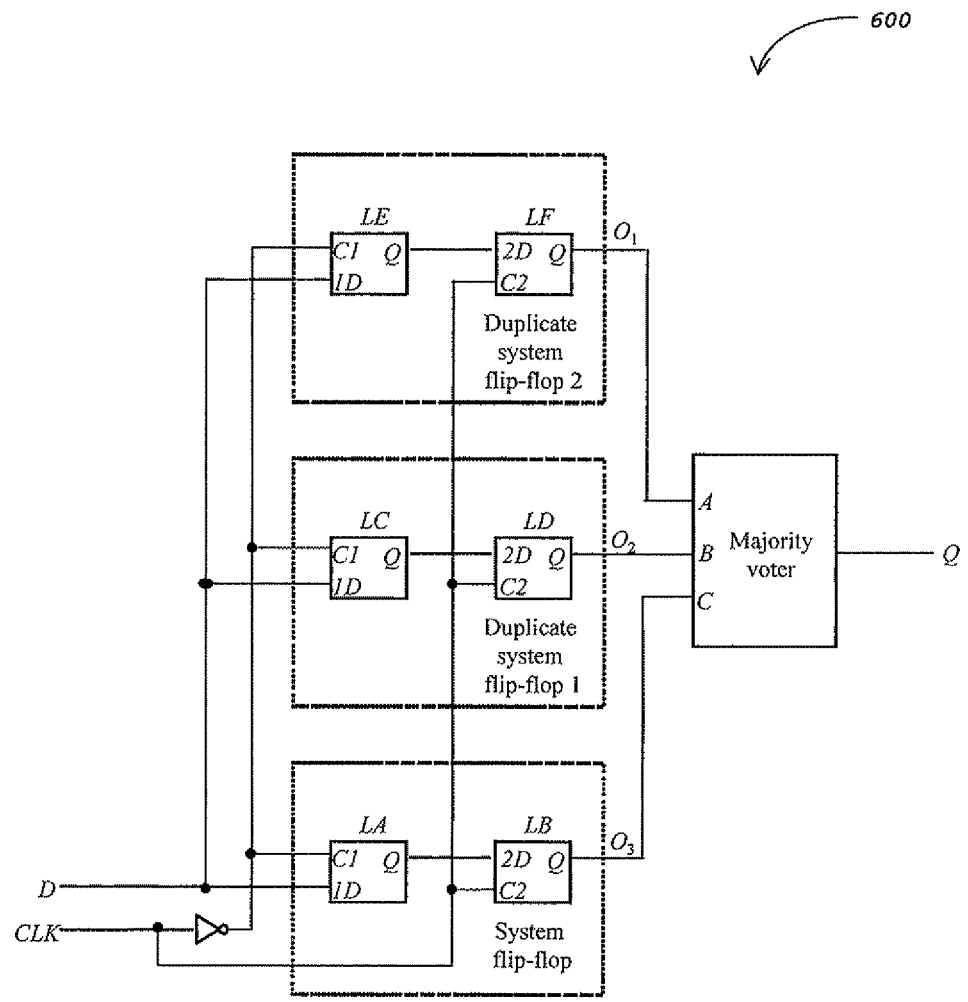

In FIG. 6, a prior art soft-error correction cell 600 is implemented using triple modular redundancy (TMR). Three copies of the system flip-flop (system flip-flop, duplicate system flip-flop 1, and duplicate system flip-flop 2) store the value of the D input on the rising edge of the clock. A majority voter is used as the output joining circuit. The majority voter output Q is equal to 1 if two or more of its inputs (O1, O2, and O3) are equal to 1, and is equal to 0 if two or more of its inputs are equal to 0. If a soft error impacts only one of the flip-flops, then the other two flip-flops will still hold the correct value and will out-vote the erroneous value such that the output of the majority voter will retain the correct value thereby mitigating the effect of the soft error.

Figure 7:
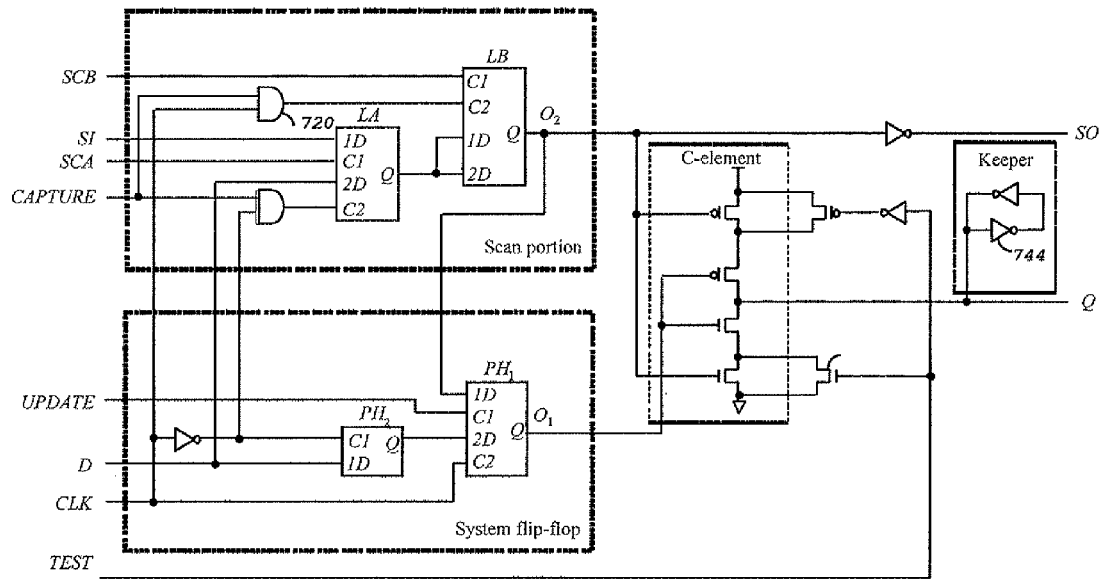

In FIG. 7, one embodiment of the present invention for adding a slow-speed snapshot capability to a BISER cell is illustrated. For illustrative purposes, it is shown embodied in a BISER cell implemented with a C-element. The design and operation of the reconfigured BISER cell 700 is identical to what was previously described for FIG. 2 with the exception of the addition of a slow-speed snapshot capability. What has been changed is the following. The latch LB has been changed from a one-port D latch to a two-port D latch. SCB drives one of the clock signals, C1, and the other clock signal is driven from the AND 720 of the CAPTURE input and the system clock CLK. Both Data inputs (1D and 2D) for latch LB come directly from the output of latch LA. The behavior of the cell in test mode is identical to what was described earlier for FIG. 2. The behavior of the cell in system mode differs in the following way. There are now two ways as shown in the table in FIG. 7 that the scan portion can operate in during system mode. If 0 is applied to the SCA, SCB, and UPDATE signals, and a 1 is applied to the CAPTURE signal, then the scan portion will shadow the operation of the system flip-flop and load data from the input D every clock cycle, the same as described earlier for FIG. 2. However, if a 0 is applied to the CAPTURE signal, then the scan portion can perform a functional testing using slow-speed snapshot. When CAPTURE is 0, the scan portion is decoupled from the system flip-flop. The system CLK is gated by the CAPTURE signal so that it can no longer trigger state changes in either latch LA or LB. The circuit state can then be shifted out by alternately applying clocks SCA and SCB which shifts the response out through output SO. The shift clock frequency at which SCA and SCB are clocked need not be related in any manner to the system clock frequency, and hence a functional testing using slow-speed snapshot can be performed at a reduced shift clock frequency, when the system clock is still running.

Figure 8:
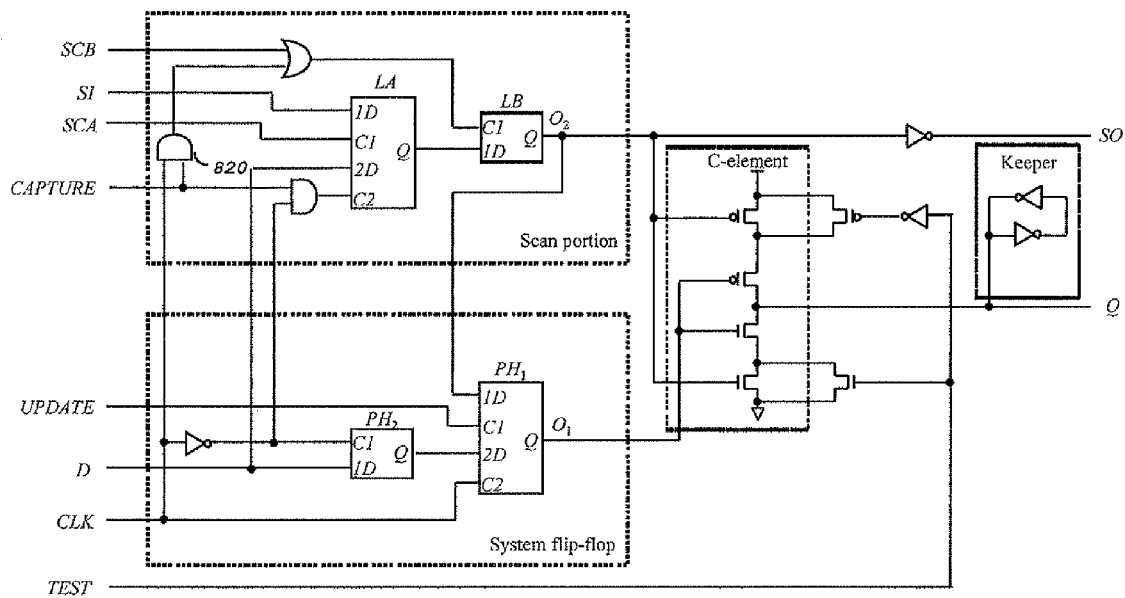

In FIG. 8, another embodiment of the present invention for adding a slow-speed snapshot capability to a BISER cell is illustrated. For illustrative purposes, it is shown embodied in a BISER cell implemented with a C-element. The design and operation of the reconfigured BISER cell 800 is identical to what was previously described for FIG. 2 with the exception of the addition of a slow-speed snapshot capability. What has been changed is the following. An AND gate 820 has been added so that the CLK signal that controls latch LB in system mode is ANDed with the CAPTURE signal. The behavior of the cell in test mode is identical to what was described earlier for FIG. 2. The behavior of the cell in system mode differs in the following way. There are now two ways as shown in the table in FIG. 8 that the scan portion can operate in during system mode. If 0 is applied to the SCA, SCB, and UPDATE signals, and a 1 is applied to the CAPTURE signal, then the scan portion will shadow the operation of the system flip-flop, the same as described earlier for FIG. 2. However, if a 0 is applied to the CAPTURE signal, then the scan portion can perform a slow-speed snapshot. When CAPTURE is 0, the scan portion is decoupled from the system flip-flop. The system clock CLK is gated by the CAPTURE signal so that it can no longer trigger state changes in either latch LA or LB. The circuit state can then be shifted out by alternately applying clocks SCA and SCB which shifts the response out through output SO. The shift frequency at which SCA and SCB are clocked need not be related in any manner to the system clock frequency, and hence a functional testing using slow-speed snapshot can be performed at a reduced shift clock frequency, when the system clock is still running.

Figure 9:
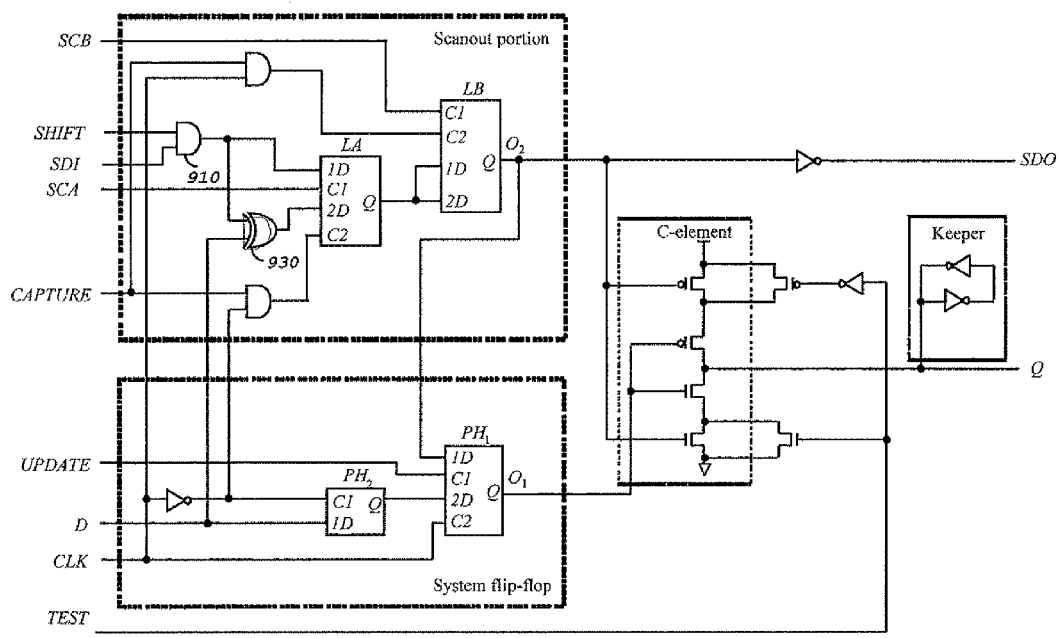

In FIG. 9, one embodiment of the present invention for adding both slow-speed snapshot and slow-speed signature analysis capabilities to a BISER cell is shown. For illustrative purposes, it is shown embodied in a BISER cell implemented with a C-element. The design and operation of the reconfigured BISER cell 900 is identical to what was previously described for FIG. 7 with the exception of the addition of a signature logic which comprises two logic gates and one input SHIFT. The two logic gates include AND gate 910 which ANDs together the input SDI with SHIFT to drive the 1D port of latch LA, and XOR gate 930 which generates the XOR of the outputs of AND gate 910 and the input D. The output of XOR gate 930 is used to drive the 2D port of latch LA. The behavior of this cell is identical to what was previously described for FIG. 7 except that when scanning data out of the cell, there are four different modes which are listed in the table in FIG. 9. If SHIFT and CAPTURE are set to 0, then a constant value is scanned out the SDO output. If SHIFT is set to 0 and CAPTURE is set to 1, then the output of latch PH1 is scanned out through SDO. If SHIFT is set to 1 and CAPTURE is set to 0, then the output of latch LB is scanned out. If both SHIFT and CAPTURE are set to 1, then the XOR value (called a signature) of the outputs of latches PH1 and LB is scanned out. This allows the circuit to run in two test modes for online test, debug, and diagnosis: functional testing using slow-speed snapshot and functional testing using slow-speed signature analysis. In slow-speed snapshot mode, the operation is identical to what was previously described for FIG. 8. In slow-speed signature analysis mode, the CAPTURE signal is set to 1 for one system clock cycle, and then set to 0 for one or more system clock cycles to match the frequency of the scan clocks SCA/SCB. For instance, if the operating frequency of the system clock CLK is 1 GHz and the shift frequency of the scan clocks SCA/SCB is 10 MHz, then the capture operation may only occur every 100 or more system clock cycles to allow for enough time to shift the previous SDI value and the SDO signature value in and out of the BISER cell 800. This is in sharp contrast to functional testing using the at-speed signature analysis technique where the CAPTURE signal is set to 1 all the time so that the capture and signature operations are performed every system clock cycle. The SDI/SDO scan chain (referred to as a debug chain) must now allow shifting data in and out of the BISER cell at-speed. In the example given above, this means the scan clocks SCA/SCB must now operate at 1 GHz instead of 10 MHz. This may drastically create routing difficulty during layout. Alternatively, when layout is not an issue, one may perform the functional testing using the at-speed signature analysis technique described here.

In FIG. 10, another embodiment of the present invention for adding both slow-speed snapshot and slow-speed signature analysis capabilities to a BISER cell is shown. For illustrative purposes, it is shown embodied in a BISER cell implemented with a C-element. The design and operation of the reconfigured BISER cell 1000 is identical to what was previously described for FIG. 8 with the exception of the addition of a signature logic which comprises two logic gates and one input SHIFT. The two logic gates include AND gate 1010 which ANDs together the input SDI with SHIFT to drive the 1D port of latch LA, and XOR gate 1030 which generates the XOR of the outputs of AND gate 1010 and the input D. The output of XOR gate 1030 is used to drive the 2D port of latch LA. The behavior of this cell is identical to what was previously described for FIG. 8 except that when scanning data out of the cell, there are four different modes which are listed in FIG. 10. If SHIFT and CAPTURE are set to 0, then a constant value is scanned out the SDO output. If SHIFT is set to 0 and CAPTURE is set to 1, then the output of latch PH1 is scanned out through SDO. If SHIFT is set to 1 and CAPTURE is set to 0, then the output of latch LB is scanned out. If both SHIFT and CAPTURE are set to 1, then the XOR value (called a signature) of the outputs of latches PH1 and LB is scanned out. This allows the circuit to run in two test modes for online test, debug, and diagnosis: functional testing using slow-speed snapshot and functional testing using slow-speed signature analysis. The operation of this cell 1000 in both modes is identical to what was previously described for FIG. 9. Alternatively, when layout is not an issue, one may perform the functional testing using the at-speed signature analysis technique described for FIG. 9.

Figure 11:
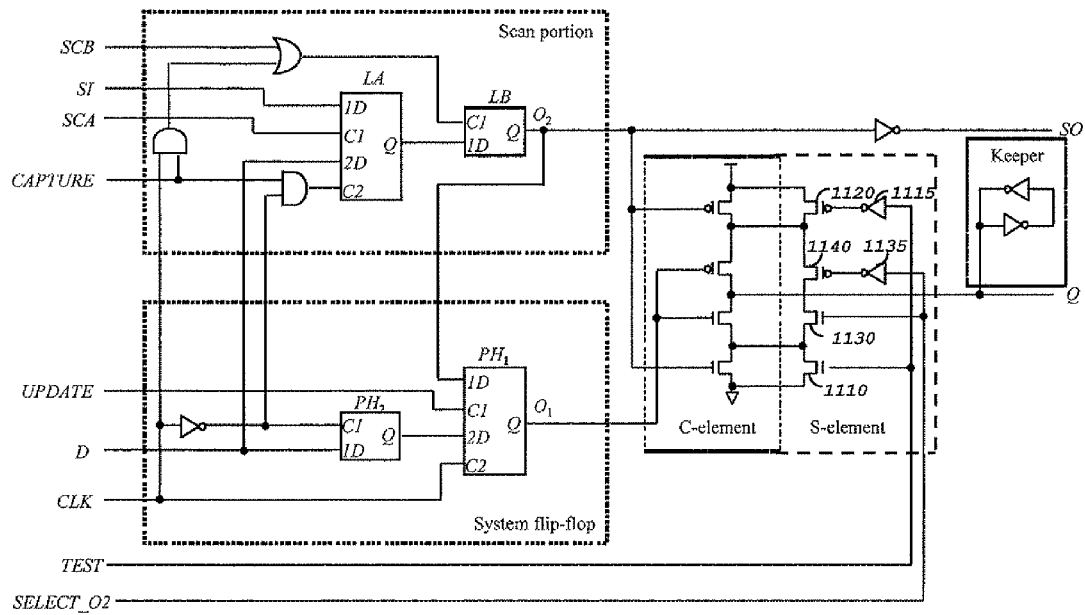

In FIG. 11, one embodiment of the present invention for adding a capability to bypass/repair a failed flip-flop to a BISER cell is illustrated. The design and operation of the reconfigured BISER cell 1100 is identical to what was previously described for FIG. 8 with the exception of the addition of an S-element which has been coupled to the C-element in the output joining circuit to allow for selective bypass/repair (referred to as defect tolerance). The S-element has two inputs, TEST and SELECT_O2. TEST controls pass transistor 1110 and is connected through inverter 1115 to control pass transistor 1120. SELECT_O2 controls pass transistor 1130 and is connected through inverter 1135 to control pass transistor 1140. The S-element truth table is shown in FIG. 11. When TEST is set to 0 and SELECT_O2 is set to 0, then the C-element behaves normally, the same way as previously described for FIG. 2 during system mode. When TEST is set of 1 and SELECT_O2 is set to 0, then the C-element inverts O1 and ignores $O_2$ thereby allowing O2 to be bypassed during system operation. When TEST is set to 0 and SELECT_O2 is set to 1, then the C-element inverts O2 and ignores O1 thereby allowing O1 to be bypassed during system operation. If there is a defect in either the system flip-flop or the scan portion, then the defect can be tolerated by bypassing that particular flip-flop using the S-element.

Figure 12:
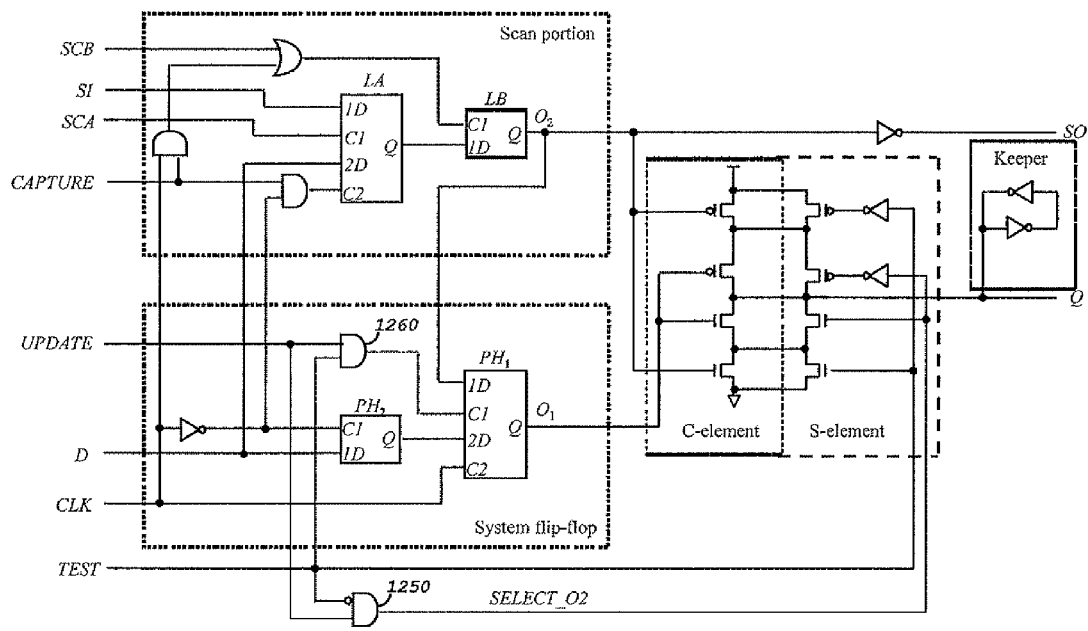

In FIG. 12, another embodiment of the present invention for adding a capability to bypass/repair a failed flip-flop to a BISER cell is illustrated. The design and operation of the reconfigured BISER cell 1200 is identical to what was previously described for FIG. 11 for defect tolerance with the exception that the SELECT_O2 signal is locally generated with AND gate 1250 instead of coming in as a primary input and the C1 input of PH1 is driven by AND gate 1260 instead of being driven directly by UPDATE. AND gate 1250 logically ANDs together UPDATE and the complement of TEST in order to locally generate the signal SELECT_O2. The S-element truth table is shown in FIG. 12. When TEST is set to 0 and UPDATE is set to 0, then the C-element behaves normally, the same way as previously described for FIG. 2 during system mode. Whenever TEST is set to 0 and UPDATE is set to 1, then the S-element will bypass the system flip-flop. Normally UPDATE is used to load the system flip-flop from the scan portion, but if the system flip-flop is being bypassed anyway, then it is not necessary to be able to load it, so the load capability can be disabled by using AND gate 1260 to block the UPDATE signal from changing the state of latch O1. On the other hand, when TEST is set to 1, then AND gate 1260 allows UPDATE to control latch PH1 so that the system flip-flop acts normally (the same way that it does in FIG. 11).

Figure 13:
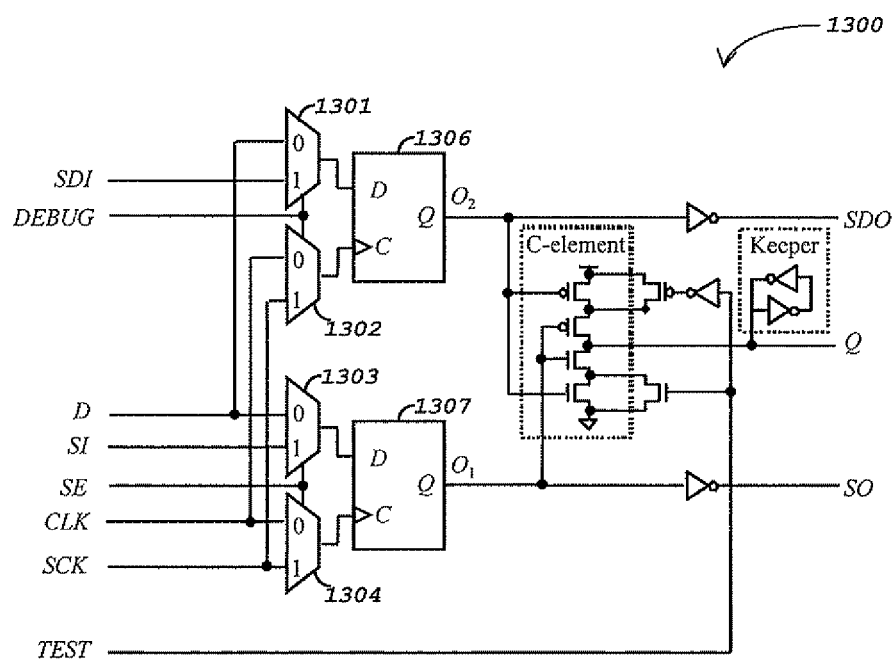

In FIG. 13, one embodiment of the present invention for a reconfigured MUX-based BISER cell to provide slow-speed snapshot, slow-speed/at-speed signature analysis, and defect tolerance capabilities is illustrated. The reconfigured cell 1300 includes two D flip-flops 1306 and 1307. Flip-flop 1306 gets its D input from a MUX 1301 which selects between D and SDI depending on the value of DEBUG, and gets its C input from a MUX 1302 which selects between the system clock CLK, and the scan clock, SCK, depending on the value of DEBUG. Flip-flop 1307 gets its D input from a MUX 1303 which selects between D and SI depending on the value of the scan enable signal, SE, and gets its C input from a MUX 1304 which selects between the system clock CLK and the scan clock SCK, depending on the value of SE. A C-element with a Keeper acts as the output joining circuit between the two flip-flops. When DEBUG is set to 0 and SE is set to 0, both flip-flops are clocked by the system clock and store the value of D. When TEST is set to 0, if the values in the two flip-flops, 1306 and 1307, mismatch, then the output of the C-element keeps its previous value to help mitigate soft errors. When DEBUG is set to 1 and SE is set to 0, then the contents of flip-flop 1306 can be shifted out through the debug chain whose shift-in goes through SDI and shift-out goes through SDO to provide a snapshot of the system state. Note that flip-flop 1307 continues to function as the system flip-flop during this time. Since the snapshot operation is controlled by a separate scan clock, SCK, the frequency at which SCK is clocked need not be related in any manner to the system clock frequency, and hence a slow-speed snapshot can be performed as was previously described in FIG. 8. When DEBUG is set to 0, SE is set to 1, and TEST is set to 1, then the contents of flip-flop 1307 can be shifted out through the scan chain whose shift-in goes through SI and shift-out goes through SO to provide a snapshot of the system state. Note that flip-flop 1306 continues to function as the system flip-flop during this time. When DEBUG is set to 1, SE is set to 1, and TEST is set to 1, then both scan chains can be shifted simultaneously. Because MUX-based D flip-flops are widely used in the industry, the SI/SO ports may stitch together to form a slow scan chain during manufacturing test, while the SDI/SDO ports may stitch together to form a debug chain for slow-speed snapshot during online test, debug, and diagnosis. The SDI/SDO ports may also stitch together to form a debug chain for slow-speed/at-speed signature analysis with the addition of signature logic which was previously described in FIG. 9. Alternatively, an S-element identical to that shown in FIG. 11 may be also coupled to the C-element to provide the cell 1300 with a defect tolerance capability.

Figure 14:
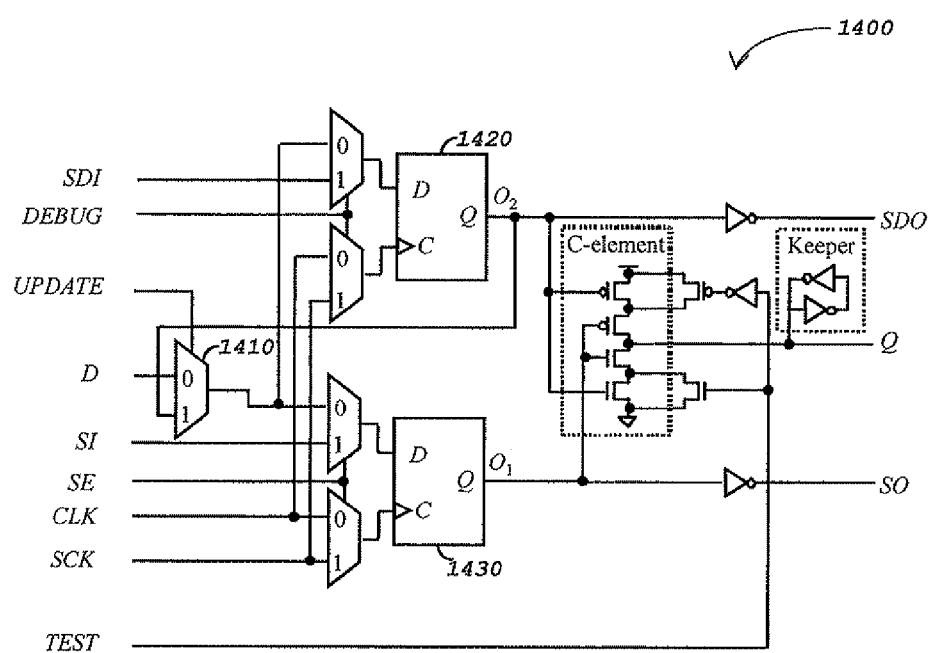

In FIG. 14, one embodiment of the present invention for a reconfigured MUX-based BISER cell to provide an additional enhanced scan capability is illustrated. The design and operation of the reconfigured cell 1400 for slow-speed snapshot, slow-speed/at-speed signature analysis, and defect tolerance is identical to what was previously described for FIG. 13. The enhanced scan capability for performing a manufacturing test in the cell 1400 may include adding a MUX 1410 to the design which is controlled by an additional input UPDATE. The MUX 1410 allows flip-flop 1430 to be loaded from either D, when UPDATE is equal to 0, or from the O2 output of flip-flop 1420, when UPDATE is equal to 1. The ability to load flip-flop 1430 with the value stored in flip-flop 1420 provides an enhanced scan capability that permits the application of any two-pattern test where the first pattern may be scanned into the flip-flop 1430 through the normal SI/SO scan chain or the SDI/SDO debug chain, and the second pattern may be scanned into the flip-flop 1430 through the SDI/SDO debug chain to launch a transition to the first pattern.

Figure 15:
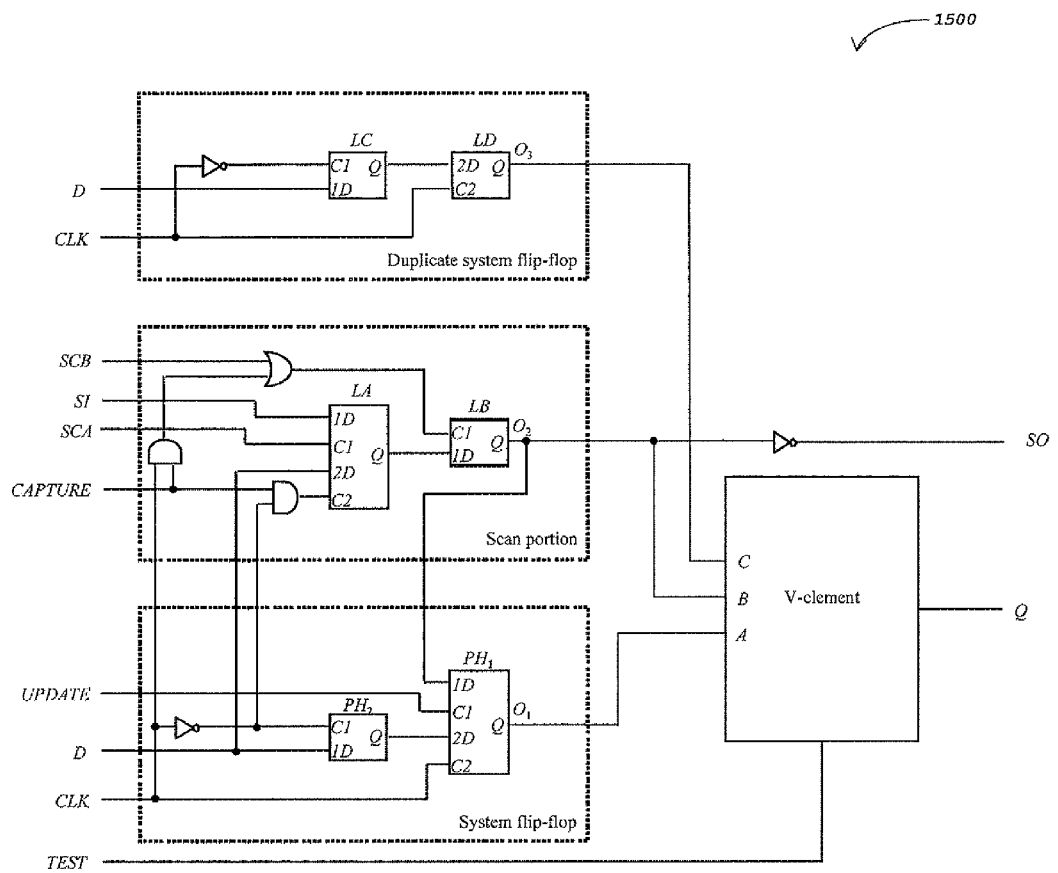

In FIG. 15, one embodiment of the present invention for a reconfigured TMR cell that uses a V-element is illustrated. The cell 1500 adopts a traditional TMR technique which employs a majority voter to correct soft errors caused by SEUs in sequential elements in the cell 1500. A sequential element may be a latch, a pulse latch, or a flip-flop. The cell 1500 may further include a system flip-flop, a scan portion, and a duplicate system flip-flop. The V-element may further include a majority voter. The outputs of these three flip-flops are inputs to the V-element which performs a majority vote to determine its final output Q. The design and operations of the system flip-flop and the scan portion are identical to what was previously described for FIG. 8. Hence, the cell 1500 can also perform a slow-speed snapshot operation as well as a manufacturing test operation. The duplicate system flip-flop is just a standard edge-triggered D flip-flop which is clocked with the system clock CLK, and stores the value on D. It consists of two latches, LC and LD, which serve as master and slave, respectively. When TEST is set to 1, then the V-element is disabled and simply connects input A to its output Q. When TEST is set to 0, then the V-element performs a majority vote of its inputs A, B, and C, to generate its output Q.

Figure 16:
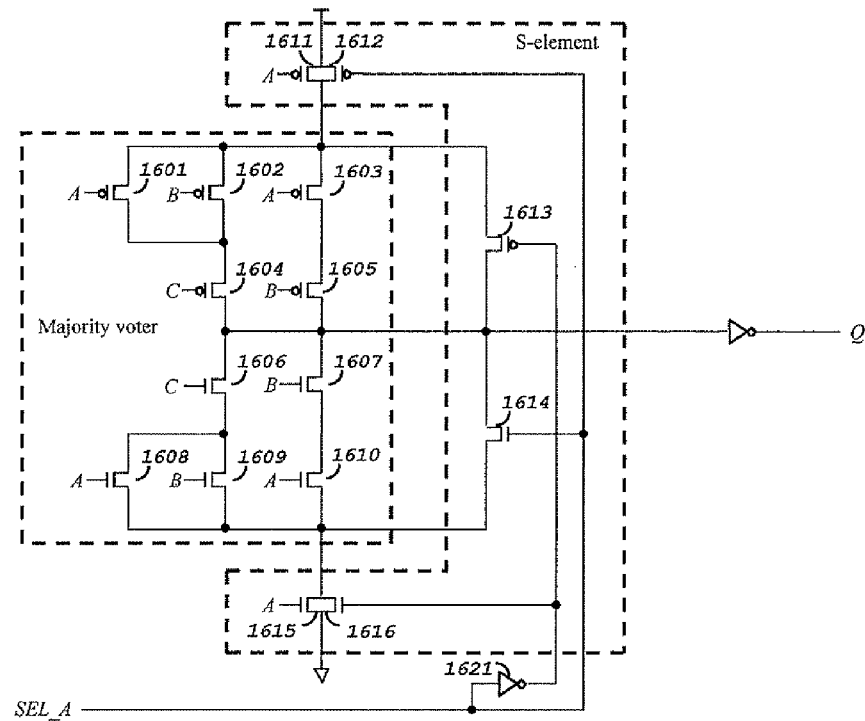

In FIG. 16, one embodiment of the present invention for a V-element is illustrated to aid in manufacturing test. The V-element 1600 consists of a majority voter coupled with a one-input S-element. One embodiment of the majority voter is shown which may consist of 10 transistors (1601, 1602, 1603, 1604, 1605, 1606, 1607, 1608, 1609, 1610) which implement the majority logic function AB+AC+BC. The S-element may consist of 6 transistors (1611, 1612, 1613, 1614, 1615, 1616) and one inverter (1621), and may include one input SEL_A which when 0 allows the majority vote to pass through to Q, but when 1 disables the majority vote and allows input A to pass through to Q. The S-element truth table is shown in FIG. 16. This V-element design can be used in the embodiment of the invention illustrated in FIG. 15.

Figure 17:
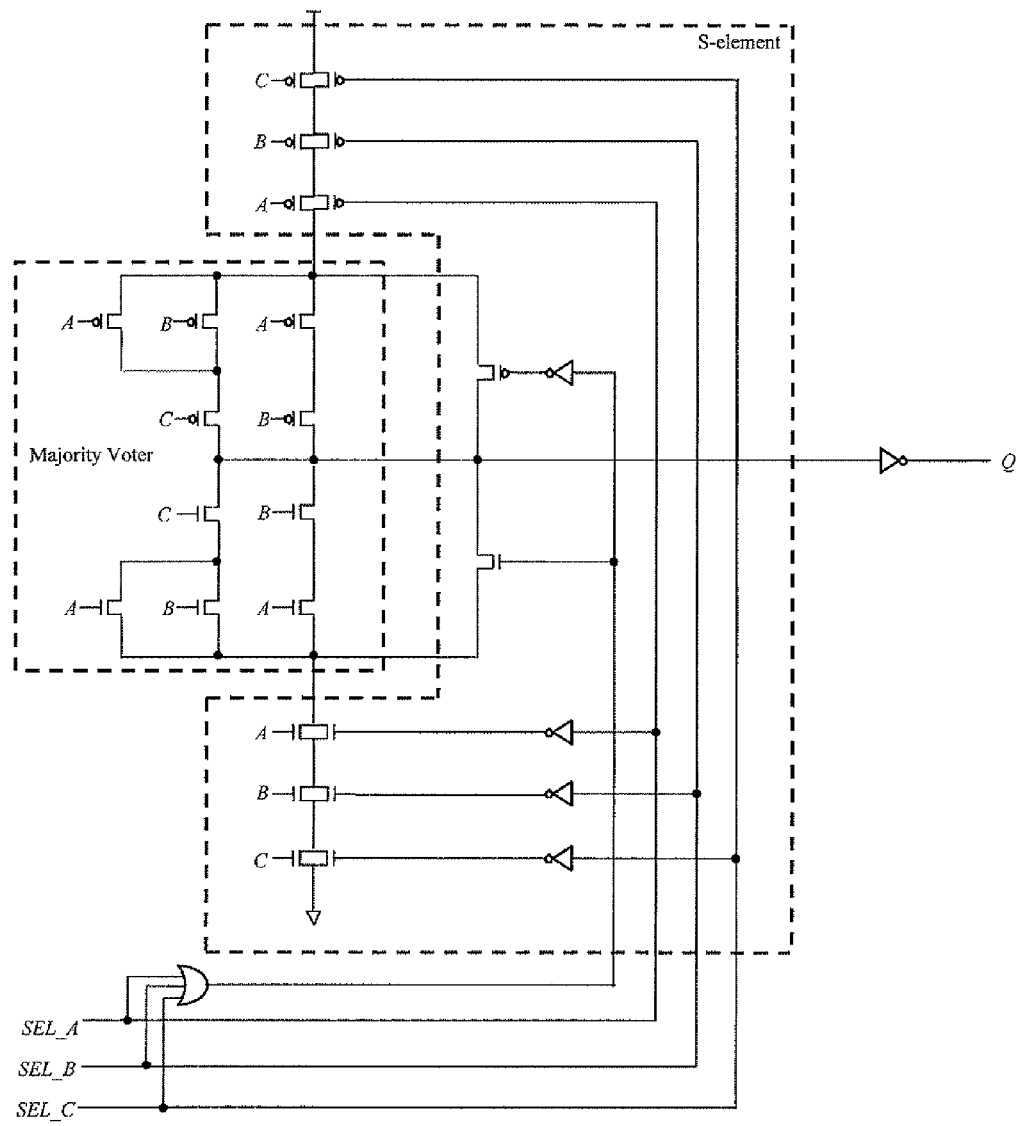

In FIG. 17, another embodiment of the present invention for a V-element to aid in defect tolerance is illustrated. The V-element 1700 consists of a majority voter coupled with a three-input S-element. The design and operation of the majority voter is identical to what was previously described in FIG. 16. The S-element truth table is shown in FIG. 17. The S-element in this case has three inputs SEL_A, SEL_B, and SEL_C, which when all 0 allows the majority vote to pass through to Q. If SEL_A is 1 while SEL_B and SEL_C are 0, then it allows input A to pass through to Q. If SEL_B is 1 while SEL_A and SEL_C are 0, then it allows input B to pass through to Q. If SEL_C is 1 while SEL_A and SEL_B are 0, then it allows input C to pass through to Q. This V-element design can be used in the embodiment of the invention illustrated in FIG. 15. One application would be to tolerate defects in the flip-flops. If one or two of the three flip-flops in FIG. 15 has a defect, then the appropriate select signal could be set to 1 to bypass the defects and use a remaining defect-free flip-flop.

Figure 18:
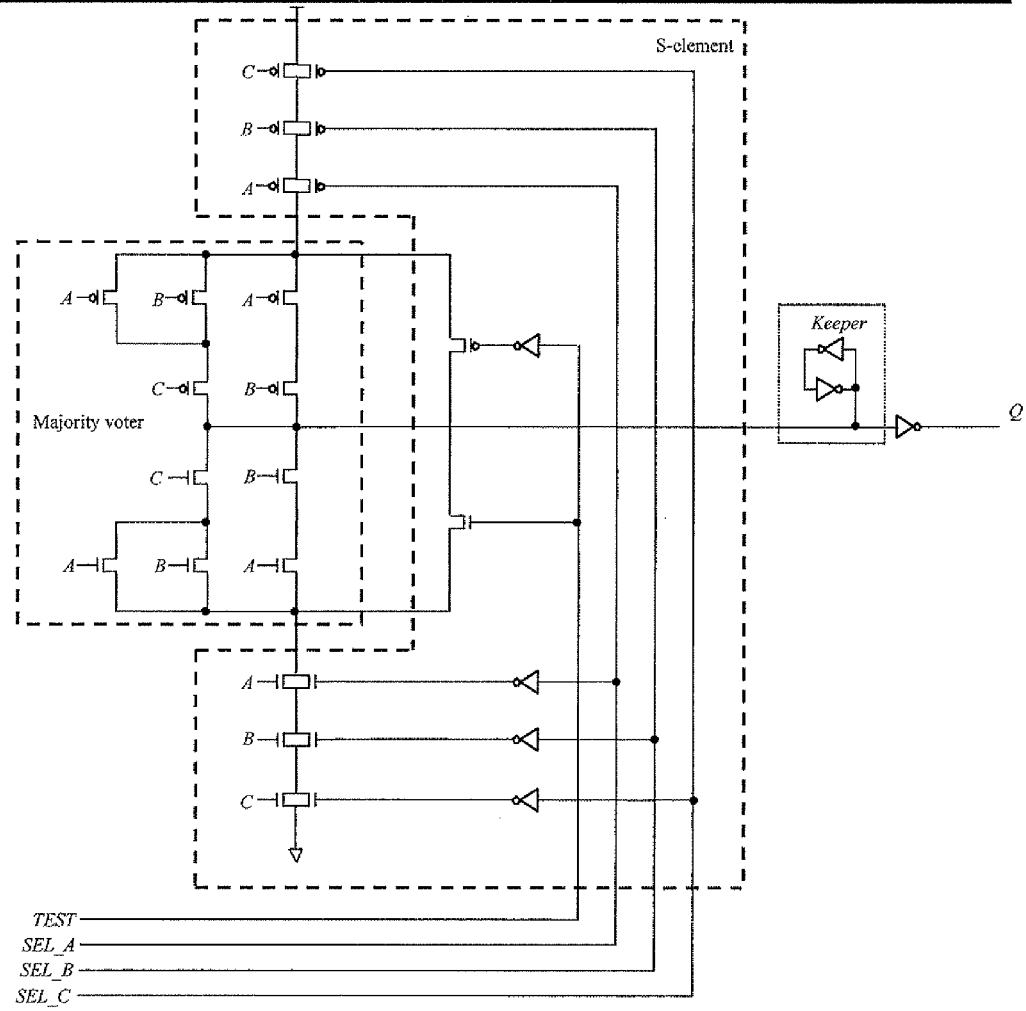

In FIG. 18, another embodiment of the present invention for a V-element is illustrated to aid in defect tolerance as well as graceful degradation. The V-element 1800 consists of a majority voter coupled with a four-input S-element and includes a Keeper at its output. The design and operation of the majority voter is identical to what was previously described in FIG. 16. The S-element truth table is shown in FIG. 18. The S-element has four inputs TEST, SEL_A, SEL_B, and SEL_C which when all 0 allows the majority vote to pass through to Q. If TEST is set to 1, then if only one of SEL_A, SEL_B, and SEL_C is 1 while the rest are 0, then one input out of A, B, and C is allowed to pass through to the output Q. If TEST is set to 1, and exactly two of SEL_A, SEL_B, and SEL_C are 1, then the S-element behaves as a C-element with the two selected inputs. This provides a graceful degradation capability to the V-element 1800. This V-element design can be used in the embodiment of the invention illustrated in FIG. 15. One application would be to tolerate a defect in one of the flip-flops while still mitigating soft errors using the two remaining flip-flops together with a joining circuit that acts as a C-element thereby preserving the BISER capability, or it can also tolerate defects in two of the flip-flops by setting the appropriate select signal to 1 to bypass the defects and use the remaining defect-free flip-flop, however, in this case the BISER capability would not be preserved.

Figure 19:
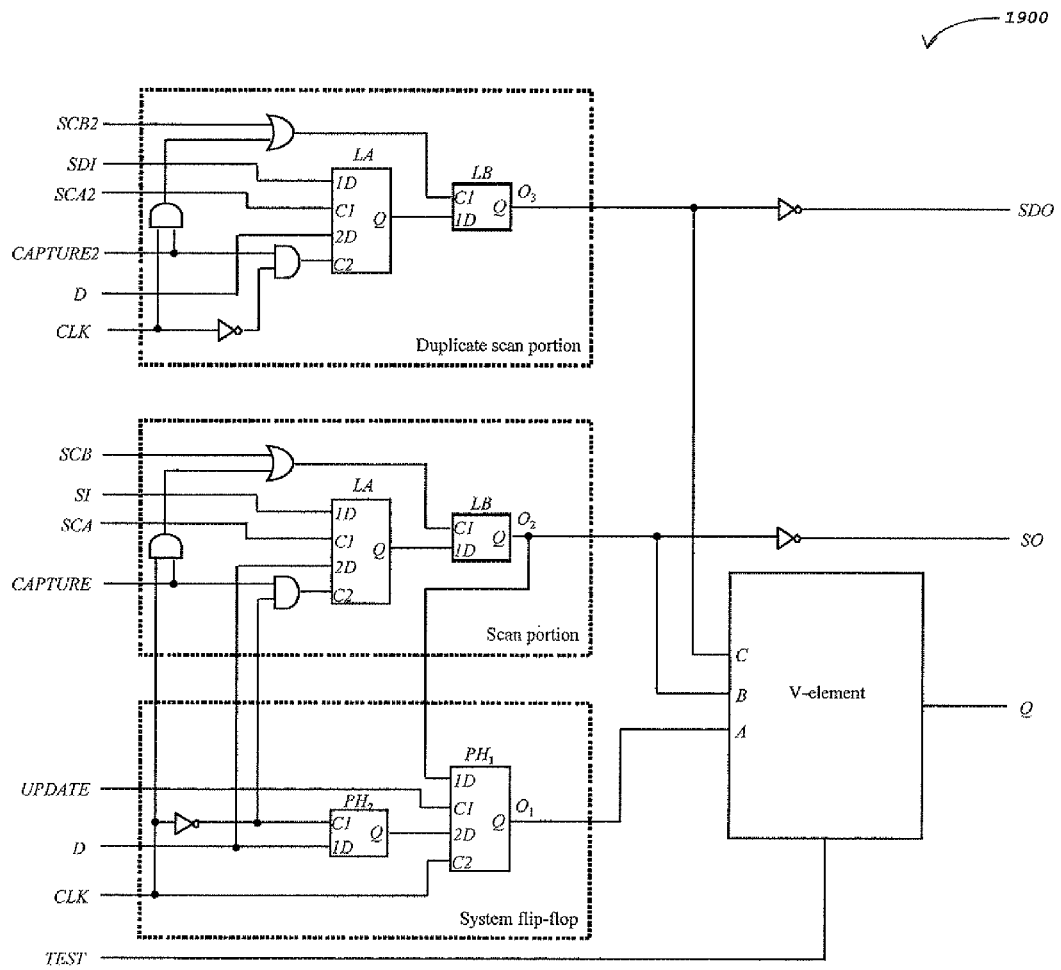

In FIG. 19, another embodiment of the present invention for a reconfigured TMR cell that uses a V-element is illustrated. The cell 1900 adopts a traditional TMR technique which employs a majority voter to correct soft errors caused by SEUs in sequential elements in the cell 1900. A sequential element may be a latch, a pulse latch, or a flip-flop. The cell 1900 may further include a system flip-flop, a scan portion, and a duplicate scan portion. The outputs of these three flip-flops are inputs to the V-element which performs a majority vote to determine its final output Q. The design and operations of the system flip-flop and the scan portion are identical to what was previously described for FIG. 8. Hence, the cell 1900 can also perform a slow-speed snapshot operation as well as a manufacturing test operation. The duplicate scan portion is simply a copy of the scan portion with a separate scan-in SDI input and scan-out SDO output which may implement a second slow scan chain or a debug chain which may be controlled by separate CAPTURE2 signal and SCA2/SCB2 scan clocks. When TEST is set to 1, then the V-element is disabled and simply connects input A to its output Q. When TEST is set to 0, then the V-element performs a majority vote of its inputs A, B, and C, to generate its output Q.

Figure 20:
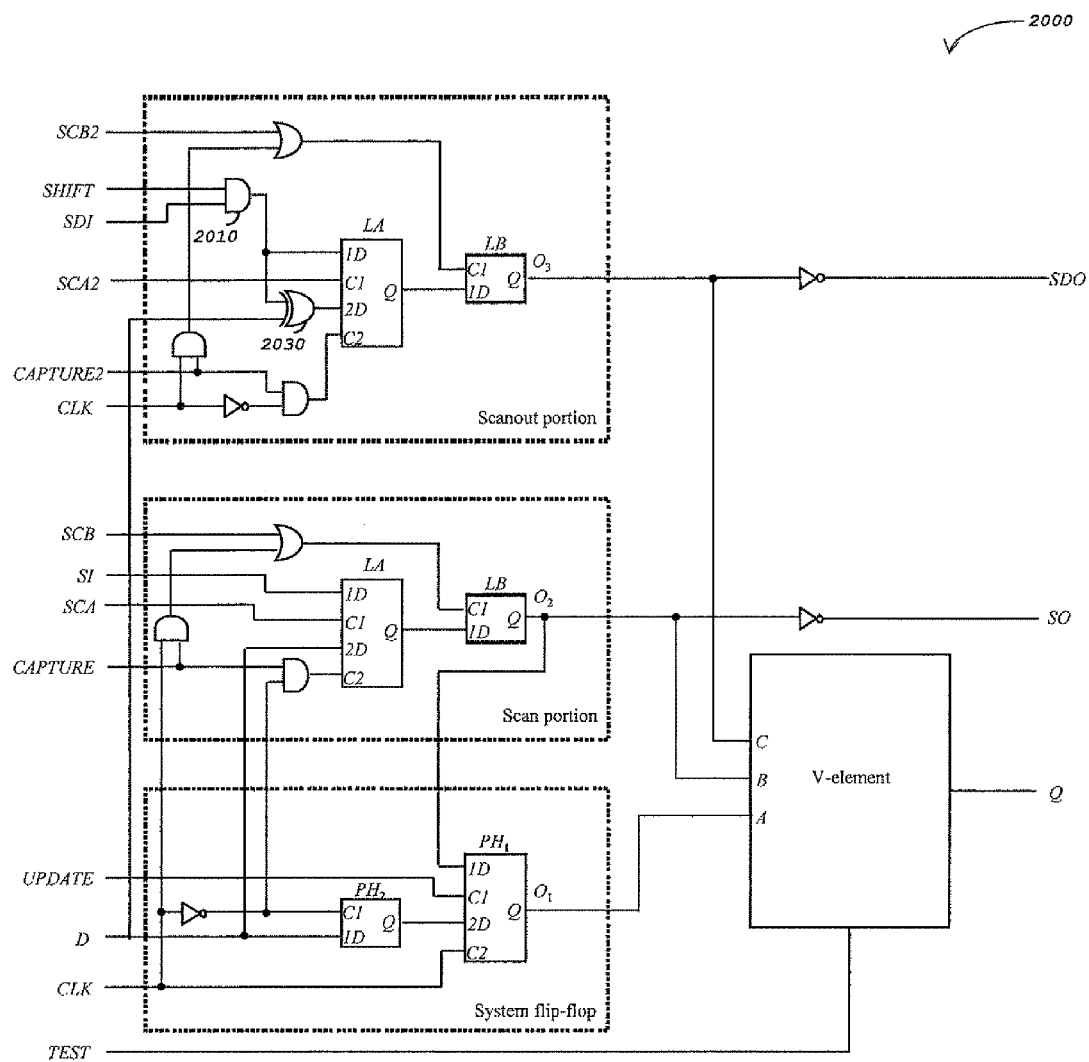

In FIG. 20, another embodiment of the present invention for a reconfigured TMR cell that uses a V-element is illustrated. The cell 2000 adopts a traditional TMR technique which employs a majority voter to correct soft errors caused by SEUs in sequential elements in the cell 1900. A sequential element may be a latch, a pulse latch, or a flip-flop. The cell 2000 may further include a system flip-flop, a scan portion, and a scanout portion. The design and operation of this cell 2000 is identical to what was previously described for FIG. 19 with the addition of a signature logic in the scanout portion which comprises two logic gates (2010, 2030) and one input SHIFT for providing an additional snapshot, a slow-speed signature analysis, or an at-speed signature analysis to the cell 2000. The design and operation of the signature logic is identical to what was previously described for FIG. 9.

Figure 21:
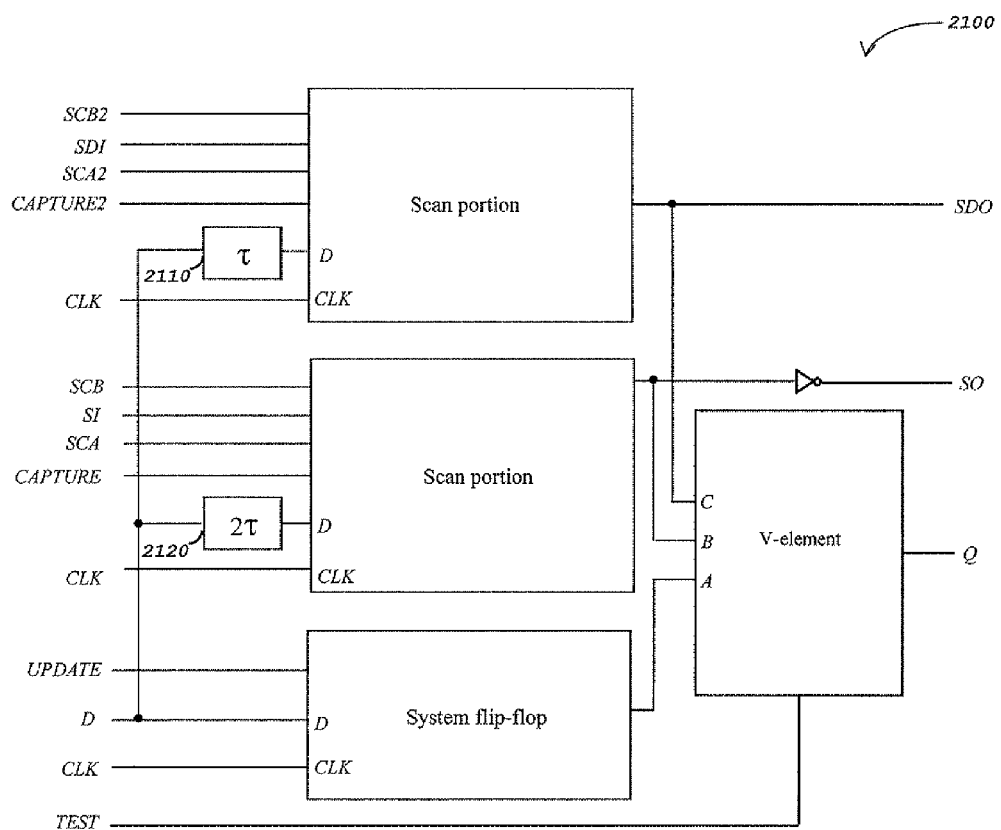

In FIG. 21, one embodiment of the present invention for a reconfigured TMR cell that uses a V-element with D delayed is illustrated. The cell 2100 adopts a traditional TMR technique which employs a majority voter to correct soft errors caused by SETs in a combinational logic which has at least a data output driving the D input of the cell 2100. The three storage blocks, namely the system flip-flop, the scan portion, and the scanout portion are shown. Alternatively, the scanout portion may be a duplicate system flip-flop or a duplicate scan portion. The V-element may further include a majority voter. Their outputs are inputs to the V-element which performs a majority vote to determine its final output Q. The design and operation of the cell 2100 is identical to what was previously described for FIG. 20 with the addition of delay elements 2110 and 2120 which are placed in front of the scan portion and the scanout portion and delay the time at which the D input arrives to those blocks. The purpose of these two delay elements is to help mitigate SETs in the combinational logic. If an SET occurs in the combinational logic whose duration is less than $\tau$, then the erroneous upset pulse on the system flip-flop will have disappeared before the upset pulse going through delay element 2110 (which adds a delay of $\tau$) arrives in the scan portions, and in turn the erroneous upset pulse on the scan portion will have disappeared before the upset going through delay element 2120 (which adds a delay of $2\tau$) arrives in the scanout portion. This ensures that no more than one input to the V-element will be in error at any given time in the presence of an erroneous SET pulse of duration less than $\tau$. Depending on the implementation of the scanout portion and the V-element as what was previously described for FIGS. 15, 19, and 20, the cell 2100 may have the additional ability to perform a manufacturing test operation, a slow-speed snapshot operation, a slow-speed or at-speed signature analysis operation, a defect tolerance operation with or without the graceful degradation capability, or any combination of the above operations.

Figure 22:
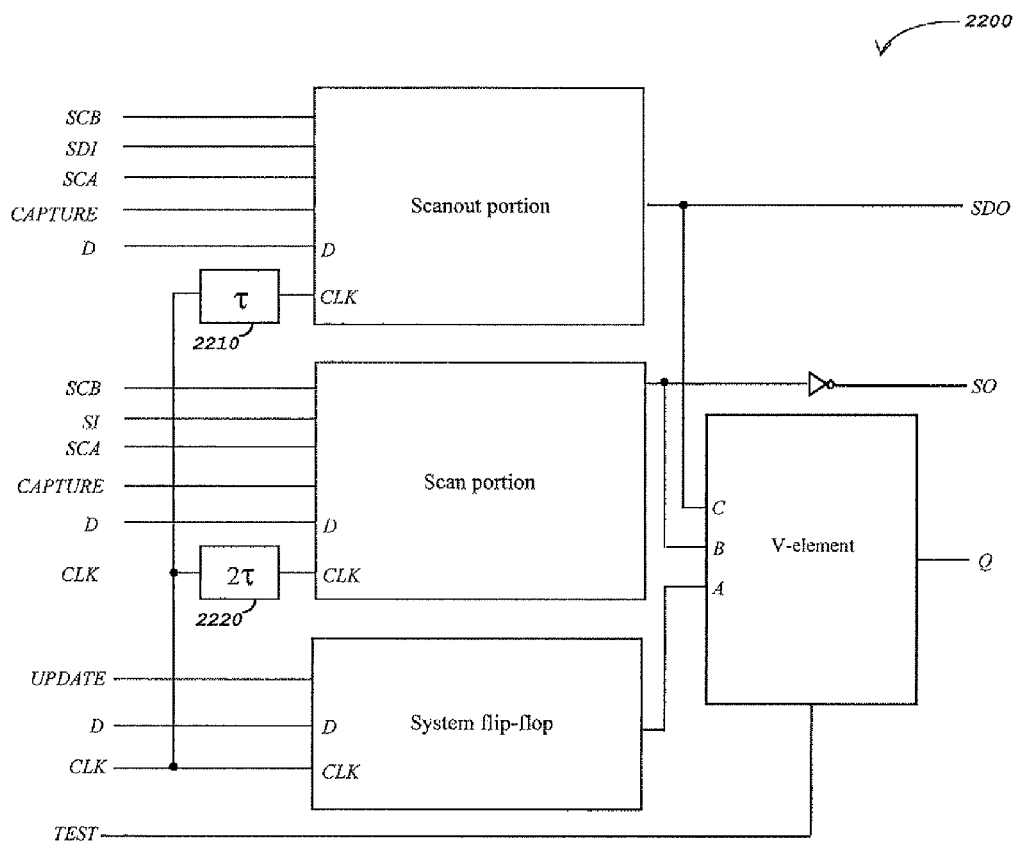

In FIG. 22, another embodiment of the present invention for a reconfigured TMR cell that uses a V-element with D delayed is illustrated. The cell 2200 adopts a traditional TMR technique which employs a majority voter to correct soft errors caused by SETs in a combinational logic which has at least a data output driving the D input of the cell 2200. The three storage blocks, namely the system flip-flop, the scan portion, and the scanout portion are shown. Alternatively, the scanout portion may be a duplicate system flip-flop or a duplicate scan portion. The V-element may further include a majority voter. Their outputs are inputs to the V-element which performs a majority vote to determine its final output Q. The design and operation of the cell 2200 is identical to what was previously described for FIG. 20 with the addition of delay elements 2210 and 2220 which are placed in front of the scan portion and the scanout portion and delay the time at which the CLK input arrives to those blocks. The purpose of these two delay elements is to help mitigate SETs in the combinational logic. If an SET occurs in the combinational logic whose duration is less than $\tau$, then the erroneous upset pulse will be captured in at most one of the three flip-flops since the time spacing between when each of the three flip-flops is clocked is staggered by $\tau$. This ensures that no more than one input to the V-element will be in error at any given time in the presence of an erroneous SET pulse of duration less than $\tau$. Depending on the implementation of the scanout portion and the V-element as what was previously described for FIGS. 15, 19, and 20, the cell 2200 may have the additional ability to perform a manufacturing test operation, a slow-speed snapshot operation, a slow-speed or at-speed signature analysis operation, a defect tolerance operation with or without the graceful degradation capability, or any combination of the above operations.

Figure 23:
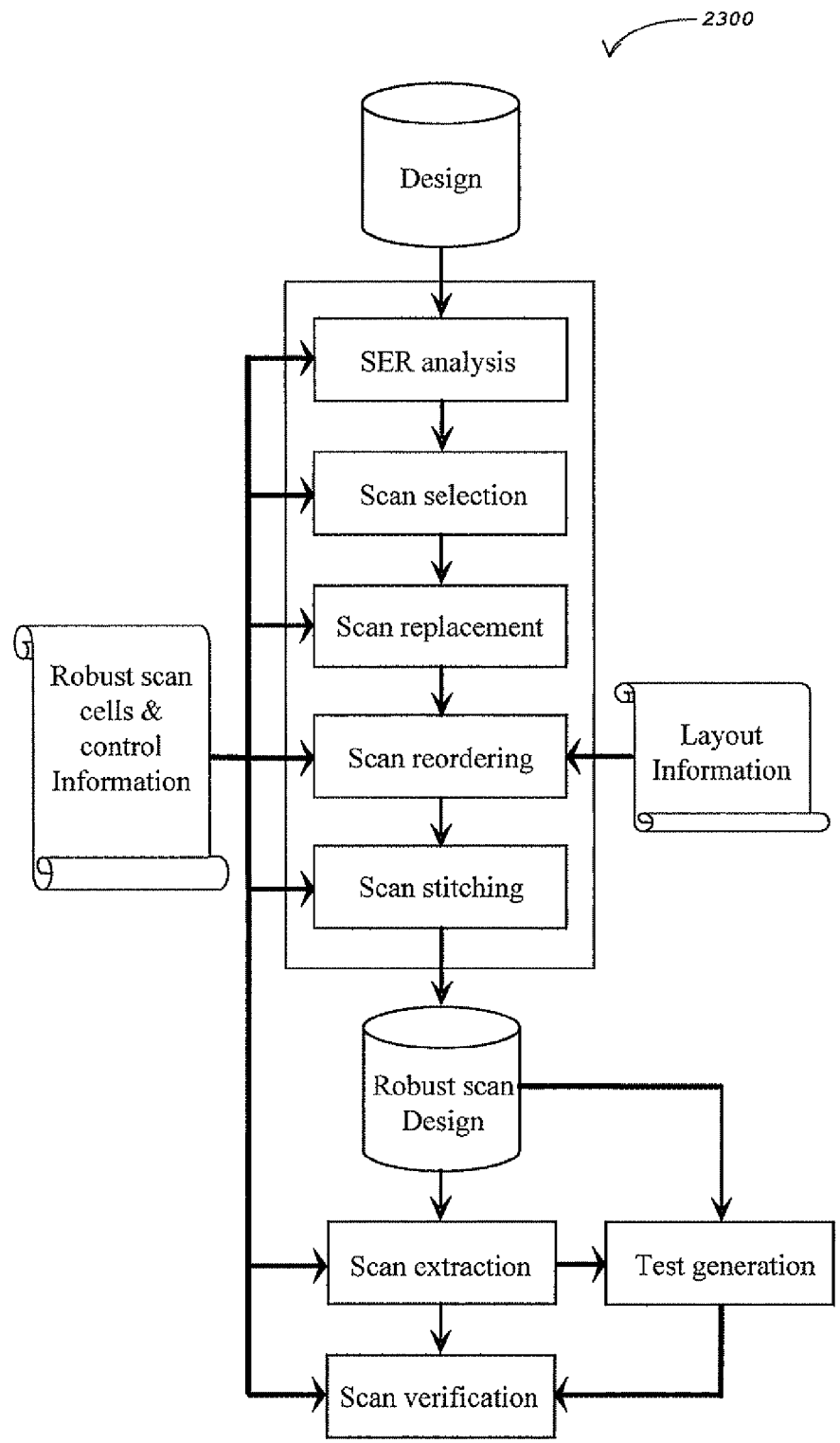

FIG. 23 is a robust scan synthesis flow, in accordance with the present invention. The design for robust scan synthesis may be modeled at a register-transfer level (RTL) or a gate level. The final synthesized robust scan design may be also modeled at a register-transfer level (RTL) or a gate level. Furthermore, logic/scan synthesis may be further performed simultaneously, if the design is described at a RT level. Alternatively scan synthesis may be further performed if the design is modeled at a gate level.

The robust scan synthesis flow may consist of several major functions. Soft-Error Rate (SER) Analysis allows users to identify and report the most susceptible logic blocks and run trade-offs to determine the best soft-error mitigation technique modeled at the RTL or the gate level. The inputs to the SER analysis program may include a scan-inserted design, SDF file, library cells, and input constraints related to radiation flux. Alternatively, SER analysis may accept a pre-determined list of robust scan cells and hardened combinational cells. A robust scan cell may be a reconfigured BISER cell, a reconfigured TMR cell, or a user-selected scan cell. After SER analysis, the program may report the soft error rate of the overall design and identify the logic blocks (signals of scan cells and combinational cells) that are most susceptible to soft errors. Alternatively, the program may report the cell-level soft error rates of the select sequential elements, scan cells, and combinational cells.

Based on the SER results, the robust scan selection and synthesis programs will automatically select signals from the SER analysis program or accept a new user-supplied signal name list, and then replace each select cell with a user-defined corresponding robust scan cell or hardened combinational cell. The inserted and stitched design is a robust design.

More specifically, scan selection allows automatically selecting or accepting a set of scan cells and combinational cells for soft-error protection, based on customer expectations on SER reduction. Scan Replacement allows automatically replacing the set of select cells with user-defined robust scan cells and hardened combinational cells. Scan Reordering allows automatically reordering the already replaced robust scan cells and hardened combinational cells in a give order according to user requirements and layout coordinates. Scan stitching allows automatically stitching the already replaced robust scan cells and hardened combinational cells into an existing scan design. Finally, Test Generation and Scan Verification automatically generate test patterns and create testbenches to verify the correctness of the robust design, respectively.

For robust scan synthesis, the flow may accept a control information file that may comprise a mapping of scan cell types to robust scan cell types, and may selectively include a list of scan cell instances for the mapping. The control information file may further comprise a mapping of combinational cell types to hardened combinational cell types, and may selectively include a list of combinational cell instances for the mapping.

Figure 24:
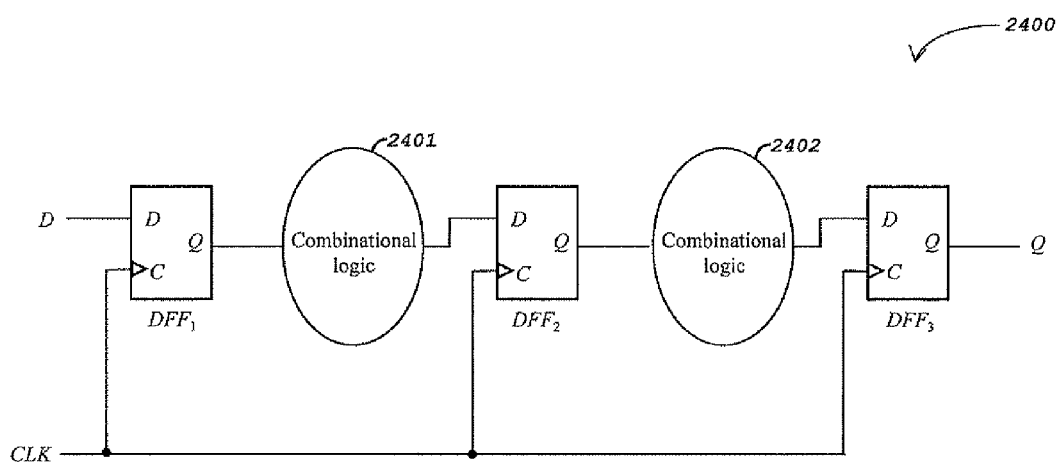

FIG. 24 illustrates a conventional D flip-flop based design in which each D flip-flop may receive its input from combinational logic and also may drive combinational logic with its output. In this particular example, the design 2400 consists of three flip-flops. Flip-flop DFF1 drives combinational logic 2401 with its output Q, and flip-flop DFF2 receives its D input from combinational logic 2401 and drives combinational logic 2402 with its output Q. Lastly, flip-flop DFF3 receives its input from combinational logic 2402. A system clock CLK is connected to all three flip-flops so they operate synchronously.

Figure 25:
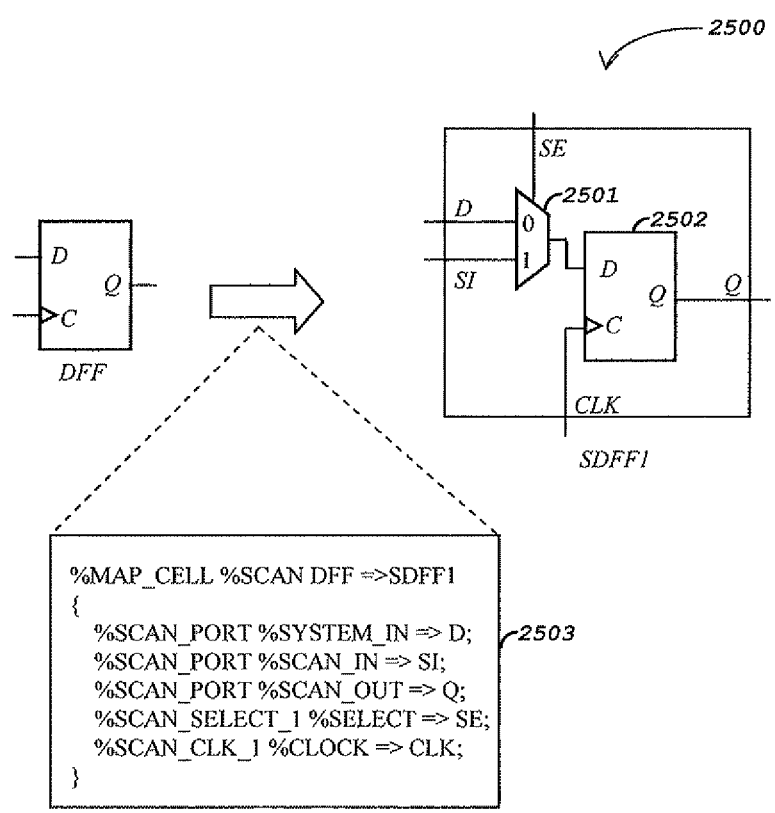
FIG. 25 is a first embodiment of a control information file used for performing a scan replacement of the example design given in FIG. 24, in accordance with the present invention.

FIG. 25 illustrates a scan replacement step in which each D flip-flop that has been selected is mapped to a particular scan cell design. In this example 2500, the D flip-flop DFF is mapped to a muxed-scan cell SDFF1 in which MUX 2501 is placed in front of flip-flop 2502. MUX 2501 selects either the D input coming from the combinational logic or the value being scanned in on SI depending on the value of the scan enable input, SE. When SE is set to 1, the flip-flop SDFF1 is in scan mode, and when SE is set to 0, the flip-flop SDFF1 is in system mode. The additional inputs that are added in the muxed-scan cell SDFF1 in comparison to the original D flip-flop DFF need to be connected in the overall design during the scan stitching phase.

Figure 26:
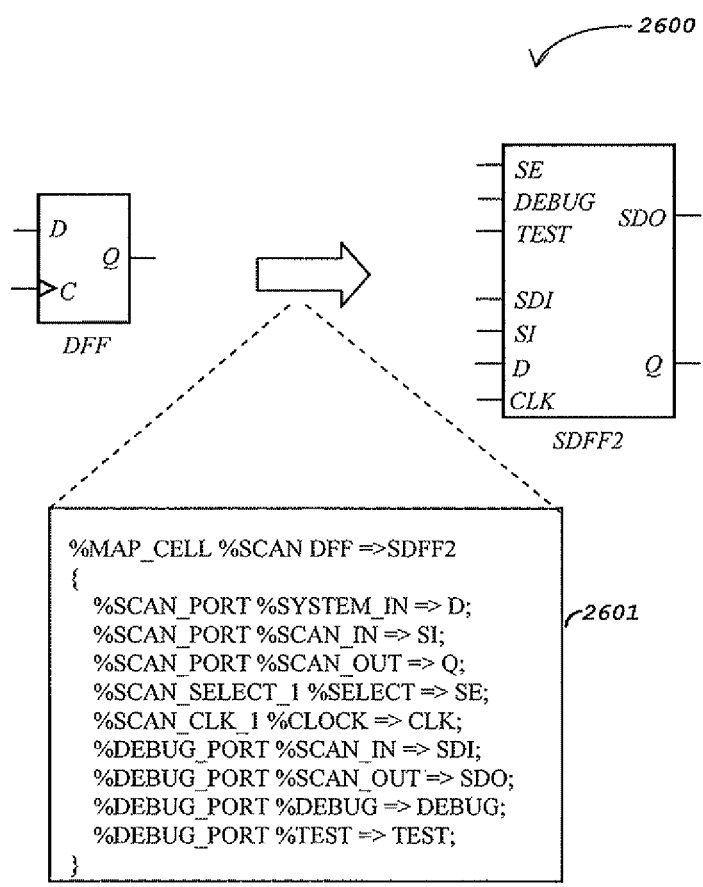
FIG. 26 is a second embodiment of a control information file used for performing a scan replacement of the example design given in FIG. 24, in accordance with the present invention.

FIG. 26 illustrates a scan replacement step in which each D flip-flop that has been selected is mapped to a scan cell with soft-error protection and debug support. In this example 2600, the D flip-flop DFF is mapped to a robust scan cell SDFF2 similar to the reconfigured BISER cell 1300 shown in FIG. 13. The mapping procedure 2601 is the same as described in FIG. 25 with the exception that this cell has more input and output signals that need to be connected during the scan stitching phase.

Figure 27:
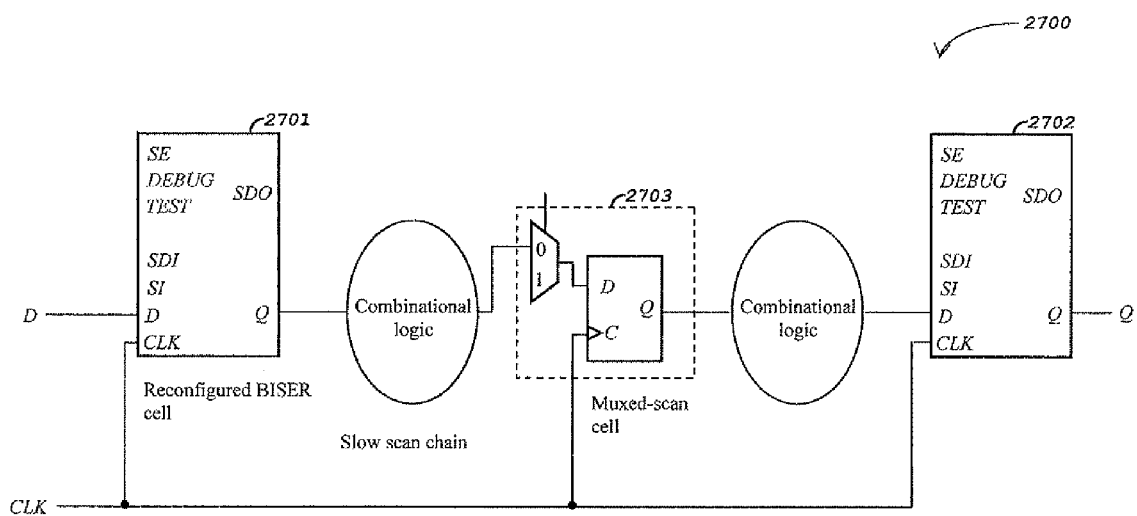
FIG. 27 is an embodiment of a scan-replaced design after performing a scan replacement of the example design given in FIG. 24 using the control information file given for FIGS. 25 and 26, in accordance with the present invention.

FIG. 27 illustrates what a conventional D flip-flop based design shown in FIG. 24 looks like after scan replacement, but before scan stitching. In this example 2700, DFF1 and DFF3 have been mapped to the reconfigured BISER cells (2701 and 2702), while DFF2 has been mapped to a conventional muxed-scan cell 2703.

Figure 28:
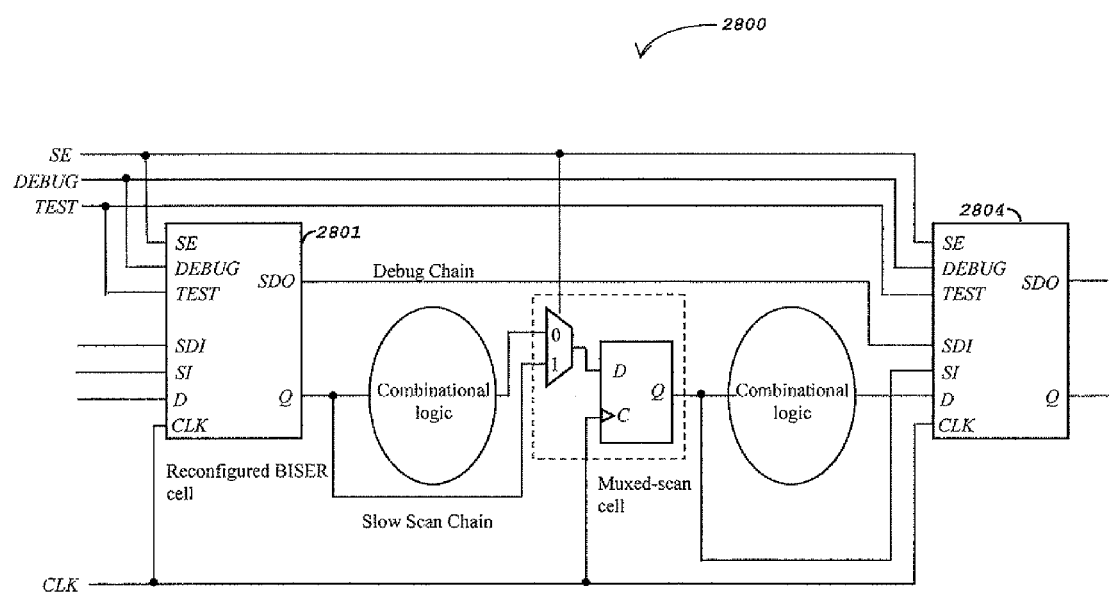
FIG. 28 is an embodiment of a synthesized robust scan design after performing a scan stitching of the scan-replaced design given in FIG. 27 for test, debug, soft-error resilience, and defect tolerance, in accordance with the present invention.

FIG. 28 illustrates a robust scan design after scan stitching has been performed on the circuit shown in FIG. 27. Scan stitching involves connecting the extra inputs and outputs of the scan cells to form the scan chains. A global scan enable signal, SE, is routed to all scan cells, and a global debug mode signal, DEBUG, and a global test mode signal, TEST, are routed to the reconfigured BISER cells (2801 and 2804). Two scan paths are connected. One is the slow scan chain which runs along the path through the SI input for cell 2801 and out through its Q output, then through the SDI input for the muxed-scan cell and out through its Q output, and finally through the SI input for cell 2804 and out through its Q output. The other is the debug chain which runs along the path through the SDI input for cell 2801 and out through its SDO output, and then through the SDI input for cell 2804 and out through its SDO output. As muxed-scan flip-flops are widely used in the industry, this robust scan design 2800 when synthesized using the robust scan synthesis flow described in FIG. 23 may be adapted to provide the conventional D flip-flop based design with an ability to perform a manufacturing test, a slow-speed or at-speed signature analysis, a soft-error resilience or correction operation, a defect tolerance, or a combination of any of the above operations.

Figure 29:
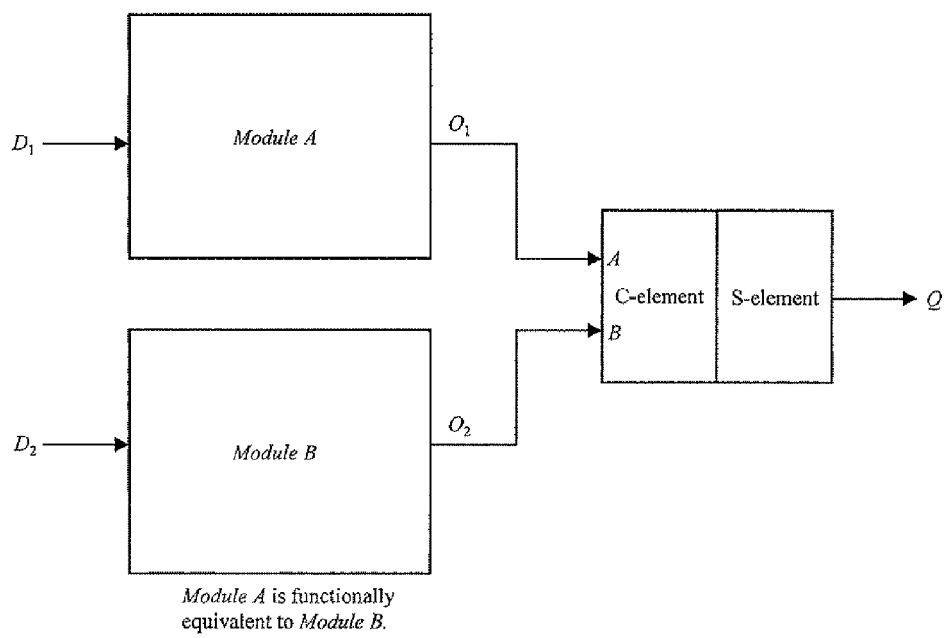
FIG. 29 is an embodiment of a robust defect-tolerance design using an S-element coupled to a C-element to protect a synchronous or asynchronous design using two or more functionally equivalent modules for error detection or correction against permanent defects.

In FIG. 29, one embodiment of the present invention for using an output joining circuit in a design which comprises at least a C-element coupled with an S-element for defect tolerance is shown. The design 2900 may include two functionally equivalent modules and the output joining circuit. The design 2900 is selectively a synchronous design with clock control, a synchronous scan design with clock control, or an asynchronous design without clock control. Each functionally equivalent module may generate at least a data output signal. The output joining circuit may comprise selectively a C-element or a majority voter coupled with an S-element. The output joining circuit which joins the data output signals of the two functionally equivalent modules together provides a defect tolerance capability to the design. The output joining circuit is adapted to tolerate defective modules. In the example 2900 shown here, the two functionally equivalent modules (illustrated as Module A and Module B) which in the error-free case produce identical outputs (illustrated here as output O1 and O2) can have an output joining circuit consisting of a C-element coupled with an S-element which produces an output Q in which the impact of soft-errors is mitigated. If either Module A or Module B is defective, then the S-element may be adapted to bypass or tolerate the defective module. The defect tolerance scheme employed here may further protect the design 2900 against permanent faults, comprising at least a structural fault or a delay fault. The structural fault may include a stuck-at fault, a stuck-open fault, a bridging fault, or an Iddq fault. The delay fault may include a transition faults or a path-delay fault.

Figure 30:
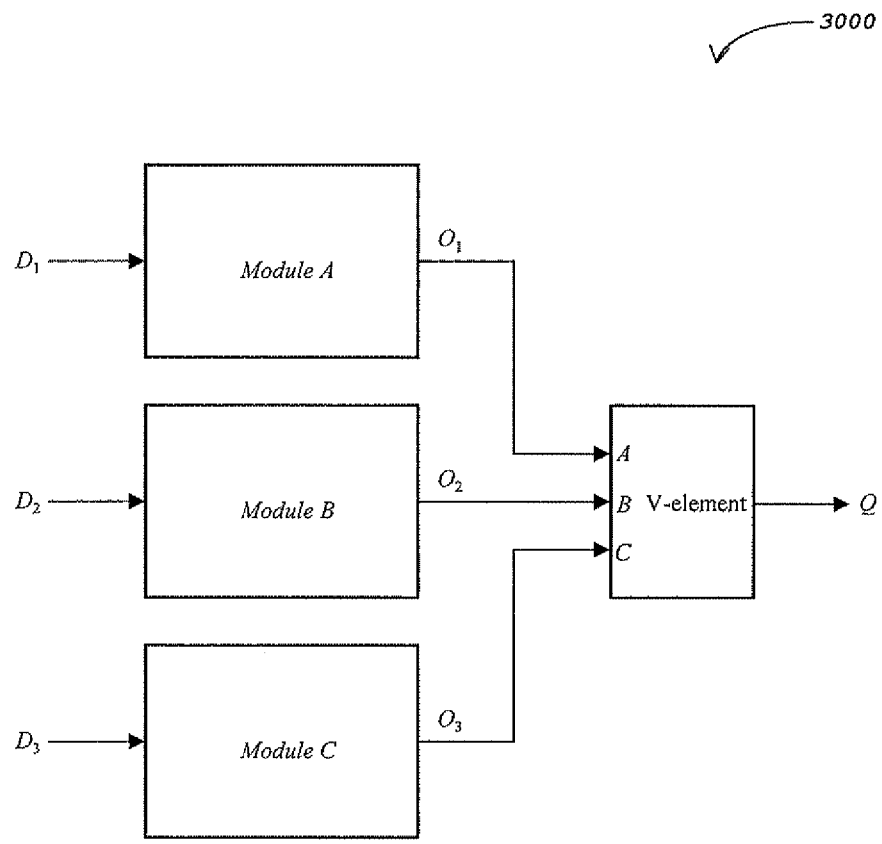
FIG. 30 is an embodiment of a robust defect-tolerance design using an S-element coupled to a TMR circuit to protect a synchronous or asynchronous design using three or more functionally equivalent modules for error detection and correction against permanent defects.

In FIG. 30, one embodiment of the present invention for using an output joining circuit in a design which comprises at least a majority voter coupled with an S-element for defect tolerance is shown. In this example 3000, the design and operation is identical to what was previously described in FIG. 29 with the exception that the C-element used in FIG. 29 is replaced with the majority voter shown here. Any three functionally equivalent modules (illustrated here as Module A, Module B, and Module C) which in the error-free case produce identical outputs (illustrated here as output O1, O2, and O3) can have an output joining circuit consisting of a V-element which produces an output Q in which the impact of soft-errors is mitigated. If any or two of the three modules are defective, then the S-element embedded in the V-element may be adapted to bypass or tolerate the defective module(s). The defect tolerance scheme employed here may further protect the design 3000 against permanent faults, comprising at least a structural fault or a delay fault. The structural fault may include a stuck-at fault, a stuck-open fault, a bridging fault, or an Iddq fault. The delay fault may include a transition faults or a path-delay fault.

Figure 31:
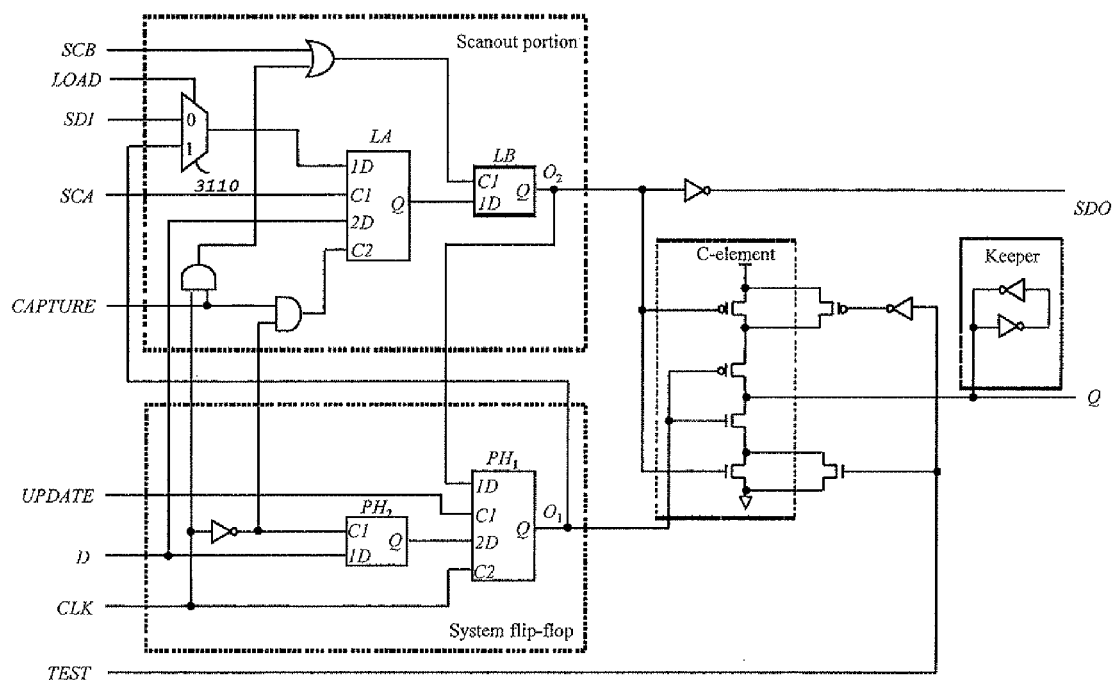
FIG. 31 is an embodiment of a reconfigured BISER cell to provide an additional manufacturing test capability for FIG. 8 that implements slow-speed snapshot, in accordance with the present invention.

In FIG. 31, an embodiment of the present invention for adding a manufacturing test circuit to a BISER cell given in FIG. 8 that implements slow-speed snapshot is shown. For illustrative purposes, it is shown embodied in a BISER cell implemented with a C-element. The design and operation of the reconfigured BISER cell 3100 is identical to what was previously described for FIG. 8 with the exception of the addition of a manufacturing test circuit which comprises a MUX 3110 and one input LOAD. MUX 3110 is used to drive the 1D port of latch LA with either the SDI input when LOAD is 0 or the output of PH1 when LOAD is 1. The behavior of this cell is identical to what was previously described for FIG. 8 except that when performing a manufacturing test operation, CAPTURE and CLK are both set to 0 first. A 1 is then applied to the LOAD signal to capture the output of latch PH1 to latch LA for scanning out to SDO for analysis. This operation allows designers to generate tests for detecting manufacturing faults or permanent defects in the circuit, including the faults present in latch PH2. The manufacturing test and snapshot operations are shown in the table in FIG. 31.

In FIG. 32, an embodiment of the present invention for adding a manufacturing test circuit to a BISER cell in FIG. 10 that implements slow-speed snapshot and slow-speed/at-speed signature analysis is shown. For illustrative purposes, it is shown embodied in a BISER cell implemented with a C-element. The design and operation of the reconfigured BISER cell 3200 is identical to what was previously described for FIG. 10 with the exception of the addition of a manufacturing test circuit which comprises a MUX 3210 and one input LOAD. MUX 3210 is used to drive the 1D port of latch LA and XOR gate 3230 with either the SDI input when LOAD is 0 or the output of PH1 when LOAD is 1. When LOAD is set to 0, the behavior of this cell is identical to what was previously described for FIG. 10. When LOAD is set to 1, two additional operations can be performed. One allows the output of latch PH1 to be captured in latch LA when SHIFT is set to 1, CAPTURE is set to 0, and LOAD is set to 1. The other is to generate a parity bit by XORing together the output of latch PH1 with the data input signal D when SHIFT is set to 1, CAPTURE is set to 1, and LOAD is set to 1. The manufacturing test and signature operations are shown in the table in FIG. 32.

In FIG. 33, an embodiment of the present invention for adding a manufacturing test circuit to a BISER cell in FIG. 10 that implements slow-speed snapshot and slow-speed/at-speed signature analysis is shown. For illustrative purposes, it is shown embodied in a BISER cell implemented with a C-element. The design and operation of the reconfigured BISER cell 3300 is identical to what was previously described for FIG. 10 with the exception of the addition of a manufacturing test circuit which comprises AND gate 3310, OR gate 3330, and one input LOAD. The output of PH1 and the LOAD input are ANDed together by AND gate 3310 whose output together with the output of AND gate 3320 are ORed together by OR gate 3330. The output of OR gate 3330 drives the 1D port of latch LA and XOR gate 3340 with either the SDI input when SHIFT is 1 and LOAD is 0, or the output of PH1 when SHIFT is 0 and LOAD is 1. When LOAD is set to 0, the behavior of this cell is identical to what was previously described for FIG. 10. When LOAD is set to 1, two additional operations can be performed. One allows the output of latch PH1 to be captured in latch LA when SHIFT is set to 0, CAPTURE is set to 0, and LOAD is set to 1. The other is to generate a parity bit by XORing together the output of latch PH1 with the data input signal D when SHIFT is set to 0, CAPTURE is set to 1, and LOAD is set to 1. The manufacturing test and signature operations are shown in the table in FIG. 33.

Having thus described presently preferred embodiments of the present invention, it can now be appreciated that the objectives of the invention have been fully achieved. And it will be understood by those skilled in the art that many changes in construction and circuitry, and widely differing embodiments and applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for performing a robust scan synthesis for soft-error resilience or soft-error correction on a design for generating a robust scan design in a system; the design modeled selectively at a register-transfer level (RTL) or a gate level; the design including at least a sequential element or a scan cell for mapping to a robust scan cell; the method comprising the computer-implemented steps of:
   (a) compiling, by using a computer, the design modeled at the RTL or the gate level into a design database;
   (b) accepting a given control information file from an external source;
   (c) performing a scan replacement on the design database based on the given control information file for replacing the sequential element or the scan cell with the robust scan cell;

(d) performing a scan stitching on the design database based on the given control information file for stitching the robust scan cell on the design database;

(e) performing a scan verification after the scan stitching for generating testbenches to verify whether the robust scan design meets the design's functional and timing requirements; and (f) generating the synthesized robust scan design at a pre-determined RTL or a pre-determined gate level.

2. The method of claim 1, wherein accepting a given control information file from an external source further includes a mapping of a scan cell type to a robust scan cell type, and selectively a mapping of a combinational cell type to a hardened combinational cell type.

3. The method of claim 2, wherein performing a scan replacement on the design database based on the given control information file further comprises replacing a select combinational cell of the combinational cell type with a hardened combinational cell of the hardened combinational cell type.

4. The method of claim 1, wherein the robust scan cell further includes a system circuit, a shadow circuit, and an output joining circuit; wherein the system circuit includes at least a first latch; the shadow circuit includes at least a second latch; and the output joining circuit selectively includes at least one transmission gate, a C-element, an XOR gate, an error detection circuit, or a triple modular redundancy (TMR) circuit.

5. The method of claim 4, wherein the first latch is selectively a system flip-flop or a pulse latch; and wherein the system circuit selectively includes a scan chain.

6. The method of claim 4, wherein the shadow circuit is selectively a scan portion or a scanout portion, wherein the scan portion includes at least a duplicate of the system circuit, and the scanout portion includes at least a duplicate of the system circuit.

7. The method of claim 4, wherein the robust scan cell further includes a debug circuit, wherein the debug circuit includes at least a third latch, and includes at least a duplicate of the system circuit.

8. The method of claim 1, further comprising performing selectively a logic synthesis, a scan synthesis, or a combination of a logic synthesis and a scan synthesis on the design modeled at the RTL.

9. The method of claim 1, further comprising performing a scan synthesis on the design modeled at the gate level.

10. The method of claim 1, further comprising performing a scan reordering after the scan replacement or the scan stitching for ordering the robust scan cells, based on a given scan instance order or a given layout coordinate file.

11. The method of claim 1, further comprising performing a scan extraction after the scan stitching to verify whether the robust scan cells are connected correctly.

12. The method of claim 1, further comprising performing a test generation after the scan stitching for generating test patterns to detect select structural or delay manufacturing faults;
wherein the structural faults include stuck-at, stuck-open, bridging, or Iddq faults, and wherein the delay fault include transition or path-delay faults.

13. The method of claim 1, further comprising performing a scan selection before the scan replacement for selectively selecting a set of sequential elements, a set of scan cells, a set of combinational cells, or any combination of the above sets that result in a pre-determined reduction in soft error rate in the design.

14. The method of claim 13, further comprising performing a soft error rate (SER) analysis before the scan selection for estimating the cell-level soft error rates of select sequential elements, scan cells, and combinational cells in the design.

15. The method of claim 1, wherein the robust scan cell is a reconfigured BISER cell, a reconfigured triple modular redundancy (TMR) cell, or a user-selected scan cell.

16. The method of claim 1, wherein the robust scan cell is adapted for performing a soft-error resilience, a soft-error correction, a basic scan testing for structural faults, a basic scan testing for delay faults, an enhanced scan testing for delay faults, a functional testing using slow-speed snapshot, a functional testing using at-speed signature analysis, a functional testing using slow-speed signature analysis, a functional testing using at-speed signature analysis that generates cell parity, a functional testing using slow-speed signature analysis that generates cell parity, a defect tolerance, or any combination of the above operations.

* * * * *